United States Patent
Yuasa et al.

(10) Patent No.: US 7,897,274 B2
(45) Date of Patent: Mar. 1, 2011

(54) MAGNETORESISTIVE DEVICE, MAGNETORESISTIVE HEAD AND MAGNETIC RECORDING-REPRODUCING APPARATUS

(75) Inventors: Hiromi Yuasa, Yokohama (JP); Masatoshi Yoshikawa, Yokohama (JP); Yuzo Kamiguchi, Yokohama (JP); Hitoshi Iwasaki, Yokohama (JP); Masashi Sahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/685,490

(22) Filed: Mar. 13, 2007

(65) Prior Publication Data
US 2007/0154740 A1   Jul. 5, 2007

Related U.S. Application Data

(62) Division of application No. 11/072,270, filed on Mar. 7, 2005, now Pat. No. 7,223,485, which is a division of application No. 10/060,247, filed on Feb. 1, 2002, now Pat. No. 6,905,780.

(30) Foreign Application Priority Data

Feb. 1, 2001 (JP) .............................. 2001-025736
Aug. 15, 2001 (JP) .............................. 2001-246613

(51) Int. Cl.
*G11B 5/39* (2006.01)
(52) U.S. Cl. ..................... 428/811.3; 428/812; 428/815; 428/816; 360/324.11; 360/324.12
(58) Field of Classification Search ........................ None
See application file for complete search history.

(56) References Cited

U.S. PATENT DOCUMENTS

| | | | |
|---|---|---|---|
| 5,668,688 A | 9/1997 | Dykes et al. | |
| 5,828,526 A * | 10/1998 | Kagawa et al. | 360/324 |
| 6,074,743 A | 6/2000 | Araki et al. | |

(Continued)

FOREIGN PATENT DOCUMENTS

EP    0877398 A2 * 11/1998

(Continued)

OTHER PUBLICATIONS

Derwent Abstract Translation of EP 791916 A2 (Derwent Acc No. 1997-427027).*

(Continued)

*Primary Examiner*—Kevin M Bernatz
(74) *Attorney, Agent, or Firm*—Oblon, Spivak, McClelland, Maier & Neustadt, L.L.P.

(57) ABSTRACT

A magnetoresistive device includes a magnetization pinned layer, a magnetization free layer, a nonmagnetic intermediate layer formed between the magnetization pinned layer and the magnetization free layer, and electrodes allowing a sense current to flow in a direction substantially perpendicular to the plane of the stack including the magnetization pinned layer, the nonmagnetic intermediate layer and the magnetization free layer. At least one of the magnetization pinned layer and the magnetization free layer is substantially formed of a binary or ternary alloy represented by the formula $Fe_a Co_b Ni_c$ (where a+b+c=100 at %, and a≦75 at %, b≦75 at %, and c≦63 at %), or formed of an alloy having a body-centered cubic crystal structure.

2 Claims, 11 Drawing Sheets

U.S. PATENT DOCUMENTS

| | | | |
|---|---|---|---|
| 6,084,752 A * | 7/2000 | Sakakima et al. | 360/319 |
| 6,114,056 A * | 9/2000 | Inomata et al. | 428/811.1 |
| 6,132,892 A | 10/2000 | Yoshikawa et al. | |
| 6,159,593 A | 12/2000 | Iwasaki et al. | |
| 6,317,297 B1 * | 11/2001 | Tong et al. | 360/314 |
| 6,466,417 B1 * | 10/2002 | Gill | 360/324.12 |
| 6,680,831 B2 * | 1/2004 | Hiramoto et al. | 360/324.11 |
| 6,767,655 B2 * | 7/2004 | Hiramoto et al. | 428/811.2 |
| 6,784,509 B2 | 8/2004 | Yuasa et al. | |
| 6,826,078 B2 | 11/2004 | Nishiyama et al. | |
| 6,905,780 B2 * | 6/2005 | Yuasa et al. | 428/611 |
| 6,917,492 B2 | 7/2005 | Matsukawa et al. | |
| 6,937,446 B2 | 8/2005 | Kamiguchi et al. | |
| 6,995,960 B2 * | 2/2006 | Seyama et al. | 360/324.11 |
| 7,029,770 B2 | 4/2006 | Shimazawa et al. | |
| 7,038,893 B2 | 5/2006 | Koui et al. | |
| 7,071,522 B2 | 7/2006 | Yuasa et al. | |
| 7,190,558 B2 | 3/2007 | Iwasaki et al. | |
| 7,223,485 B2 * | 5/2007 | Yuasa et al. | 428/812 |
| 2001/0040781 A1 | 11/2001 | Tanaka et al. | |
| 2002/0048128 A1 | 4/2002 | Kamiguchi et al. | |
| 2002/0051380 A1 * | 5/2002 | Kamiguchi et al. | 365/158 |
| 2002/0058158 A1 * | 5/2002 | Odagawa et al. | 428/692 |
| 2002/0073785 A1 | 6/2002 | Prakash et al. | |
| 2003/0011945 A1 | 1/2003 | Yuasa et al. | |
| 2003/0072111 A1 * | 4/2003 | Hasegawa et al. | 360/324.12 |
| 2003/0206384 A1 * | 11/2003 | Hoshiya et al. | 360/324.12 |

FOREIGN PATENT DOCUMENTS

| | | |
|---|---|---|
| JP | 08-49063 | 2/1996 |
| JP | 9-186375 | 7/1997 |
| JP | 9-288807 | 11/1997 |
| JP | 11-3584 | 1/1999 |
| JP | 11-103102 | 4/1999 |
| JP | 11-121832 | 4/1999 |
| JP | 11-134620 | 5/1999 |
| JP | 11-154609 A | 6/1999 |
| JP | 11-168250 | 6/1999 |
| JP | 11-296820 | 10/1999 |
| JP | 11-353867 | 12/1999 |
| JP | 2000-101164 | 4/2000 |
| JP | 2000-228004 | 8/2000 |
| JP | 2001-006126 | 1/2001 |
| JP | 2001-094173 | 4/2001 |
| JP | 2001-94173 | 4/2001 |

OTHER PUBLICATIONS

J. Appl. Phys. 81 4573 (1997); C. Vouille at al, "Inverse CPP-GMR in (A/Cu/Co/Cu) multilayers . . . by impurities."

J. Magn. Magn. Mater. 195 (1999) L269; A.C. Reilly et al, "Perpendicular giant magnetoresistance of . . . unified picture."

J. Magn. Magn. Mater. 200 (1999) 274; J. Bass et al, "Current-perpendicular (CPP) magnetoresistance in magnetic metallic multilayers."

Meguro, K., Hoshiya, H., Watanabe, K., Hamakawa, Y., and Fuyama, M. (IEEE Trans. Mag., 35(5), 1999, 2925-2927).

L. Villa et al., Journal of Applied Physics, vol. 87, 12, pp. 8610-8614, "Current Perpendicular Magnetoresistance of NiFeCo and NiFe"Permalloys, Jun. 15, 2000.

U.S. Appl. No. 11/551,868, filed Oct. 23, 2006, Yoshikawa, et al.

U.S. Appl. No. 12/409,654, filed Mar. 24, 2009, Yoshikawa, et al.

Office Action issued Dec. 21, 2010 in Japanese Patent Application 2008-137210, filed May 26, 2008 (with English translation).

* cited by examiner

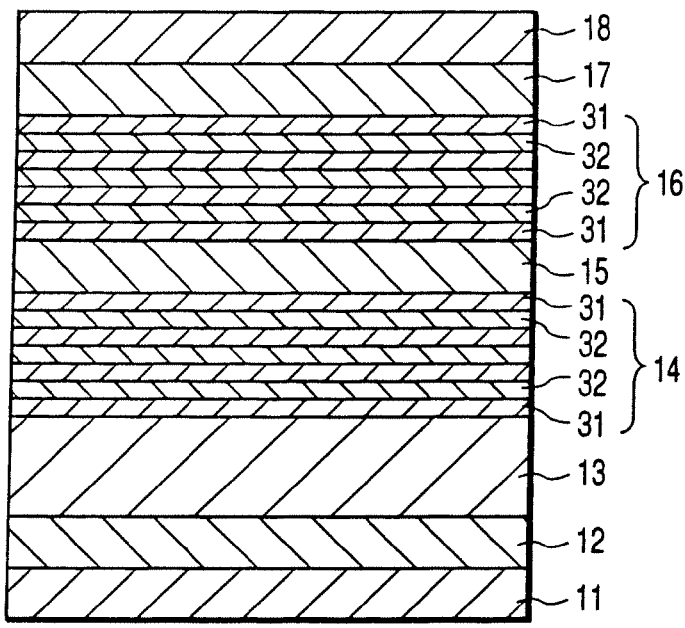
F I G. 14
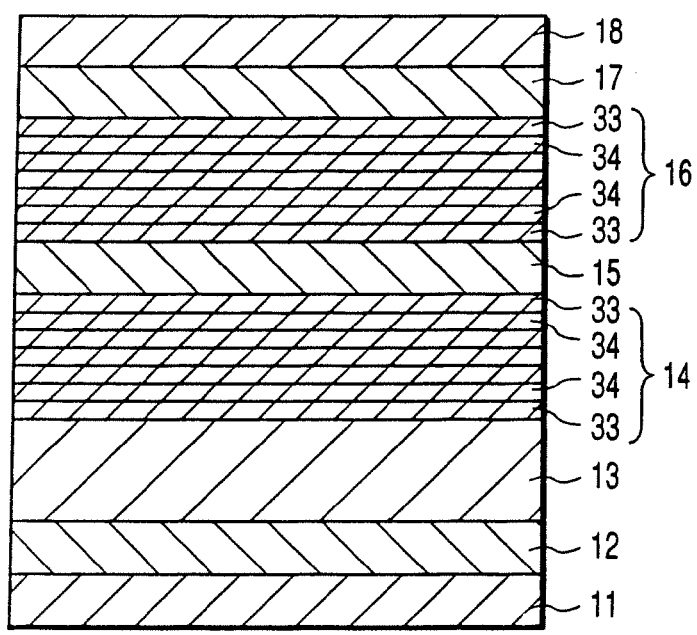
F I G. 15

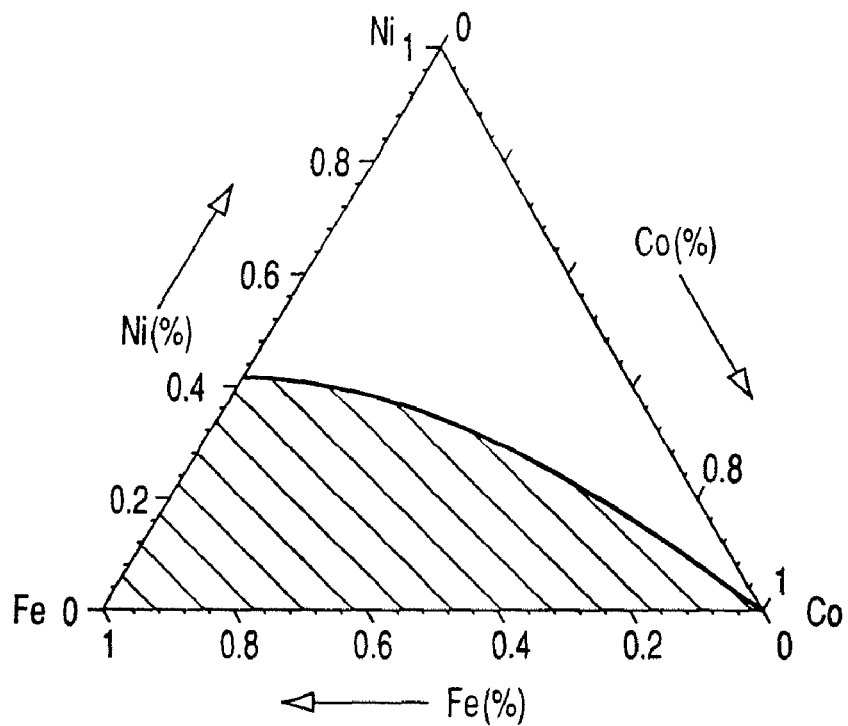
F I G. 20
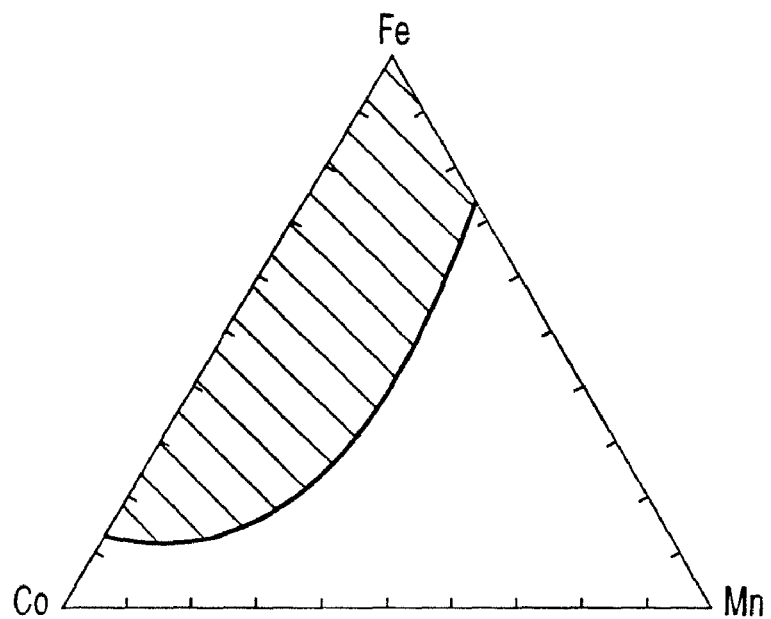
F I G. 21

MAGNETORESISTIVE DEVICE, MAGNETORESISTIVE HEAD AND MAGNETIC RECORDING-REPRODUCING APPARATUS

CROSS-REFERENCE TO RELATED APPLICATIONS

This application is a division of and claims the benefit of priority under 35 U.S.C. §120 from U.S. Ser. No. 11/072,270, filed Mar. 7, 2005, which is a divisional of 10/060,247, filed Feb. 1, 2002, and claims the benefit of priority under 35 U.S.C. §119 from Japanese Patent Application No. 2001-025736, filed Feb. 1, 2001; and Japanese Patent Application No. 2001-246613, filed Aug. 15, 2001. The entire contents of each of these applications are incorporated herein by reference.

BACKGROUND OF THE INVENTION

1. Field of the invention

The present invention relates to a magneto-resistive device in which a sense current is allowed to flow in a direction perpendicular to film plane for detecting an external magnetic field as well as to a magnetic head and a magnetic recording-reproducing apparatus.

2. Description of the Related Art

Conventionally, read-out of information recorded in a magnetic recording medium has been performed with a reproduce magnetic head including a coil, which is moved relative to the recording medium so as to detect a voltage induced in the coil by electromagnetic induction. Then, a magnetoresistive device (hereinafter referred to as MR device) has been developed and has been used in, for example, a magnetic field sensor and a magnetic head (hereinafter referred to as MR head) mounted to a magnetic recording-reproducing apparatus such as a hard disk drive.

In recent years, a marked progress has been achieved in miniaturization and increase in capacity of the magnetic recording medium, which lowers a relative speed between the reproduce magnetic head and the magnetic recording medium in reading out information. Therefore, a high expectation is put on the MR head that permits a high output even if the relative speed noted above is low.

Under the circumstances, it is reported in, for example, Phys. Rev. Lett., 61, 2474 (1988) and Phys. Rev. Lett., 64, 2304 (1999), that a so-called artificial lattice film produces a gigantic magnetoresistance effect. The artificial lattice film is a multilayered film prepared by alternately laminating ferromagnetic metal films and nonmagnetic metal films, such as Fe/Cr and Fe/Cu, under predetermined conditions such that adjacent ferromagnetic metal films are antiferromagnetically coupled with each other. However, the artificial lattice film requires a high magnetic field for saturating the magnetization and, thus, is not adapted for use as a film material for the MR head.

On the other hand, some examples are reported that a multilayered film of a sandwich structure of [ferromagnetic layer/nonmagnetic layer/ferromagnetic layer] produces a large magnetoresistance effect even if the ferromagnetic layers are not antiferro-magnetically coupled with each other. To be more specific, an exchange bias magnetic field is applied to one of the two ferromagnetic layers having the nonmagnetic layer interposed therebetween so as to fix the magnetization, and the magnetization of the other ferromagnetic layer is reversed by an external magnetic field such as a signal magnetic field. As a result, a large magnetoresistance effect can be obtained by changing a relative angle of directions of the magnetization of the two ferromagnetic layers arranged to have the nonmagnetic layer sandwiched therebetween. The multilayered film of this type is called a spin valve, as reported in, for example, Phys. Rev., B45, 806 (1992) and J. Appl. Phys., 69, 4774 (1981). The spin valve, which permits saturating the magnetization with a low magnetic field, is adapted for use in the MR head and has already been put to a practical use. However, a coefficient of magnetoresistance change (GMR coefficient) is at most about 20% for the spin valve, making it necessary to develop an MR device exhibiting a higher GMR coefficient.

In the conventional MR device, the sense current is allowed to flow within the film plane (Current in Plane: CIP). On the other hand, it is reported in, for example, J. Phys. Condens. Matter., 11, 5717 (1999) that, if the sense current is allowed to flow in a direction perpendicular to the film plane (Current Perpendicular to Plane: CPP), it is possible to obtain a GMR coefficient about 10 times as much as that for CIP mode and, thus, a GMR coefficient of 100% is not impossible. However, in the spin valve structure, the total thickness of the layer dependent on spin is very small, and the number of interfaces is small, with the result that the resistance itself is rendered low in the case of current perpendicular to plane and an absolute value of output is rendered small. If the current perpendicular to plane is applied to the spin valve of the structure employed in the conventional CIP mode, the absolute value of output $A\Delta R$ per 1 $\mu m^2$ is small, i.e., about 0.5 m$\Omega$ $\mu m^2$, in the case where the thickness of the pinned layer and the free layer is 5 nm and, thus, a further increase in the output is required.

In order to obtain a high output in the spin valve structure, it is important to increase the resistance value of the portion involved in the spin dependent conduction so as to increase change in the resistance.

SUMMARY OF THE INVENTION

An object of the present invention is to increase change in the resistance by arranging an appropriate material in at least one of the pinned layer and the free layer in a current perpendicular to plane type magnetoresistive device having a spin valve structure.

According to an aspect of the present invention, there is provided a magnetoresistive device, comprising: a magnetization pinned layer of which magnetization direction is substantially pinned to one direction; a magnetization free layer of which magnetization direction is changed in accordance with an external magnetic field; a nonmagnetic intermediate layer formed between the magnetization pinned layer and the magnetization free layer; and electrodes allowing a sense current to flow in a direction substantially perpendicular to the plane of the stack including the magnetization pinned layer, the nonmagnetic intermediate layer and the magnetization free layer, wherein at least one of the magnetization pinned layer and the magnetization free layer is substantially formed of a binary alloy or a ternary alloy represented by general formula (1) or (2) given below:

where T1 and T2 are different from each other and selected from the group consisting of Fe, Co and Ni, 25 at %≦a≦75 at %, 25 at %≦b≦75 at %, and a+b=100; and 0<c≦75 at %, 0<d≦75 at %, 0<e≦63 at %, and c+d+e=100.

According to another aspect of the present invention, there is provided a magnetoresistive device of a current perpendicular to plane type as described above, wherein at least one of the magnetization pinned layer and the magnetization free layer is formed of an alloy represented by general formula (3) or (4) given below:

$$(T1_{a/100}T2_{b/100})_{100-x}M1_x \qquad (3)$$

$$(T1_{c/100}T2_{d/100}T3_{e/100})_{100-x}M1_x \qquad (4)$$

where T1, T2 and T3 are different from each other and selected from the group consisting of Fe, Co and Ni; M1 is at least one element selected from the group consisting of Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F; 25 at %≦a≦75 at %, 25 at %≦b≦75 at %, and a+b=100; 5 at %≦c≦90 at %, 5 at %≦d≦90 at %, 5 at %≦e≦90 at %, and c+d+e=100; and 0.1 at %≦x≦30 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (5) given below:

$$Fe_{100-a}T1_a \qquad (5)$$

where T1 is at least one element selected from the group consisting of Co, Cr, V, Ni, Rh, Ti, Mo, W, Nb, Ta, Pd, Pt, Zr and Hf; and 0 at %≦a<70 atomic %; and wherein the alloy has a body-centered cubic crystal structure.

According to another aspect of the present invention, there is provided a magnetoresistive device of a current perpendicular to plane type as described above, wherein at least one of the magnetization pinned layer and the magnetization free layer is substantially formed of an alloy represented by general formula (6) given below:

$$Fe_{100-a}T1_a \qquad (6)$$

where 0 at %≦a≦80 at %, in the case where T1 is Co;
0 at %≦a≦80 at %, in the case where T1 is Cr;
0 at %≦a≦70 at %, in the case where T1 is V;
0 at %≦a≦20 at %, in the case where T1 is Ni;
0 at %≦a≦55 at %, in the case where T1 is Rh; and
0 at %≦a≦51 at %, in the case where T1 is Ti; and wherein the alloy has a body-centered cubic crystal structure.

According to another aspect of the present invention, there is provided a magnetoresistive device of a current perpendicular to plane type as described above, wherein at least one of the magnetization pinned layer and the magnetization free layer is formed of a ternary alloy selected from the group consisting of an Fe—Co—Ni alloy, a Co—Mn—Fe alloy and an Fe—Cr—Co alloy; and wherein the ternary alloy has a body-centered cubic crystal structure. FIG. 20 is a phase diagram showing the composition region of the Fe—Co—Ni alloy forming a body-centered cubic crystal structure. In a thin film, it is possible for the alloy to assume a body-centered cubic crystal structure in the region shaded in the phase diagram of FIG. 20 depending on the quality of the film, even if the film is in non-equilibrium. FIG. 21 is a phase diagram showing the composition region of the Co—Mn—Fe alloy forming a body-centered cubic crystal structure. It is also possible for the alloy to assume a body-centered cubic crystal structure in the region shaded in the phase diagram of FIG. 21. Further, it is possible for the Fe—Cr—Co alloy to assume a body-centered cubic crystal structure in substantially the entire composition region.

According to another aspect of the present invention, there is provided a magnetoresistive device of a current perpendicular to plane type as described above, wherein at least one of the magnetization pinned layer and the magnetization free layer is substantially formed of an alloy represented by any of general formulas (7) to (10) given below:

$$(Fe_{(100-a)/100}T1_{a/100})_{100-x}M_x \qquad (7)$$

$$(Fe-Co-Ni)_{100-x}M_x \qquad (8)$$

$$(Co-Mn-Fe)_{100-x}M_x \qquad (9)$$

$$(Fe-Cr-Co)_{100-x}M_x \qquad (10)$$

where T1 is at least one element selected from the group consisting of Co, Cr, V, Ni, Rh, Ti, Mo, W, Nb, Ta, Pd, Pt, Zr and Hf, and 0 at %≦a<70 atomic %; the Fe—Co—Ni alloy is in a composition region forming a body-centered cubic crystal; the Co—Mn—Fe alloy is in a composition region forming a body-centered cubic crystal structure; the Fe—Cr—Co alloy is in a composition region forming a body-centered cubic crystal structure; 0.1 at %≦x≦20 at %, in the case where M is at least one element selected from the group consisting of Mn, Cu, Re, Ru, Pd, Pt, Ag, Au and Al; and 0.1 at %≦x≦10 at %, in the case where M is at least one element selected from the group consisting of Sc, Zn, Ga, Ge, Zr, Hf, Y, Tc, B, In, C, Si, Sn, Ca, Sr, Ba, O, F and N; and wherein the alloy has a body-centered cubic crystal structure.

According to another aspect of the present invention, there is provided a magnetoresistive device of a current perpendicular to plane type as described above, wherein at least one of the magnetization pinned layer and the magnetization free layer is substantially formed of an alloy represented by general formula (11) given below:

$$(Fe_{(100-a)/100}T1_{a/100})_{100-x}M_x \qquad (11)$$

where 0 at %≦a≦80 at %, in the case where T1 is Co;
0 at %≦a≦80 at %, in the case where T1 is Cr;
0 at %≦a≦70 at %, in the case where T1 is V;
0 at %≦a≦10 at %, in the case where T1 is Ni;
0 at %≦a≦55 at %, in the case where T1 is Rh;
0 at %≦a≦51 at %, in the case where T1 is Ti;
0.1 at %≦x≦20 at %, in the case where M is at least one element selected from the group consisting of Mn, Cu, Re, Ru, Pd, Pt, Ag, Au and Al; and
0.1 at %≦x≦10 at %, in the case where M is at least one element selected from the group consisting of Sc, Zn, Ga, Ge, Zr, Hf, Y, Tc, B, In, C, Si, Sn, Ca, Sr, Ba, O, F and N; and wherein the alloy has a body-centered cubic crystal structure.

According to another aspect of the present invention, there is provided a magnetoresistive device of a current perpendicular to plane type as described above, wherein at least one of the magnetization pinned layer and the magnetization free layer is substantially formed of an alloy represented by general formula (12) given below:

$$(Fe_{(100-a)/100}T1_{a/100})_{100-x}M_x \qquad (12)$$

where T1 is at least one element selected from the group consisting of Co and Ni, and 0 at %≦a≦50 at %; and M is at least one element selected from the group consisting of Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and 0.1 at %≦x≦30 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (13) given below:

$$(Fe_{(100-a)/100}T1_{a/100})_{100-x}M_x \qquad (13)$$

where T1 is at least one element selected from the group consisting of Co and Ni, and 0 at %≦a ≦50 at %; and M is at least one element selected from the group consisting of Cu, Zn and Ga, and 0.1 at %≦x≦30 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (14) given below:

$$Fe_{100-x}M_x \qquad (14)$$

where M is at least one element selected from the group consisting of Co and Ni, and 0.1 at %≦x≦5 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (15) given below:

$$(Co_{(100-a)/100}T1_{a/100})_{100-x}M_x \qquad (15)$$

where T1 is at least one element selected from the group consisting of Fe and Ni, and 0 at %≦a≦50 at %; and M is at least one element selected from the group consisting of Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and 0.1 at %≦x≦30 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (16) given below:

$$(Co_{(100-a)/100}T1_{a/100})_{100-x}M_x \qquad (16)$$

where T1 is at least one element selected from the group consisting of Fe and Ni, and 0 at %≦a≦50 at %; and M is at least one element selected from the group consisting of Sc, Ti, Mn, Cu and Hf, and 0.1 at %≦x≦30 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (17) given below:

$$Co_{100-x}M_x \qquad (17)$$

where M is at least one element selected from the group consisting of Fe and Ni, and 0.1 at %≦x≦5 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (18) given below:

$$(Ni_{(100-a)/100}T1_{a/100})_{100-x}M_x \qquad (18)$$

where T1 is at least one element selected from the group consisting of Co and Fe, and 0 at %≦a≦50 at %; and M is at least one element selected from the group consisting of Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and 0.1 at %≦x≦30 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (19) given below:

$$(Ni_{(100-a)/100}T1_{a/100})_{100-x}M_x \qquad (19)$$

where T1 is at least one element selected from the group consisting of Fe and Co, and 0 at %≦a≦50 at %; and M is at least one element selected from the group consisting of Sc, Ti, Mn, Zn, Ga, Ge, Zr and Hf, and 0.1 at %≦x≦30 at %.

According to another aspect of the present invention, there is provided a magnetoresistive device of a current perpendicular to plane type as described above, wherein at least one of the magnetization pinned layer and the magnetization free layer is substantially formed of an alloy represented by general formula (20) given below:

$$Ni_{100-x}M_x \qquad (20)$$

where M is at least one element selected from the group consisting of Fe and Co, and 0.1 at %≦x≦5 at %.

According to another aspect of the present invention, there is provided a magnetoresistive device of a current perpendicular to plane type as described above, wherein at least one of the magnetization pinned layer and the magnetization free layer is substantially formed of a binary alloy or a ternary alloy represented by general formula (21-a) or (21-b) given below:

$$(T1_aT2_b)_{100-x}M_x \qquad (21\text{-}a)$$

$$(Fe_cCo_dNi_e)_{100-x}M_x \qquad (21\text{-}b)$$

where T1 and T2 are different from each other and selected from the group consisting of Fe, Co and Ni, 25 at %≦a≦75 at %, 25 at %≦b≦75 at %, and a+b=100; 0<c≦75 at %, 0<d≦75 at %, 0≦e≦63 at %, and c+d+e=100; and M is at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and 0.1 at %≦x≦20 at %.

According to another aspect of the present invention, there is provided a magnetoresistive device of a current perpendicular to plane type as described above, wherein at least one of the magnetization pinned layer and the magnetization free layer has a laminate structure comprising alternately laminated layers of: (i) at least one layer substantially formed of an alloy represented by general formula (22-a) or (22-b) given below:

$$T1_aT2_b \qquad (22\text{-}a)$$

$$Fe_cCo_dNi_e \qquad (22\text{-}b)$$

where T1 and T2 are different from each other and selected from the group consisting of Fe, Co and Ni, 25 at %≦a≦75 at %, 25 at %≦b≦75 at %, and a+b=100; and 0<c≦75 at %, 0<d≦75 at %, 0<e≦63 at %, and c+d+e=100; and (ii) at least one layer formed of at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and having a thickness falling within a range of between 0.03 nm and 1 nm.

According to another aspect of the present invention, there is provided a magnetoresistive device of a current perpendicular to plane type as described above, wherein at least one of the magnetization pinned layer and the magnetization free layer is substantially formed of an alloy represented by general formula (23) or (24) given below:

$$(Ni_aFe_bCo_c)_{100-x}M_x \qquad (23)$$

$$(Ni_dFe_{100-d})_{100-x}M_x \qquad (24)$$

where $0<a \leq 75$ at %, $0<b \leq 75$ at %, $0<c \leq 75$ at %, and $a+b=100$; 75 at % $\leq d \leq 85$ at %; and M is at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and 0.1 at % $\leq x \leq 20$ at %.

According to another aspect of the present invention, there is provided a magnetoresistive device of a current perpendicular to plane type as described above, wherein at least one of the magnetization pinned layer and the magnetization free layer has a laminate structure comprising alternately laminated layers of: (i) at least one layer substantially formed of an alloy represented by general formula (25) or (26) given below:

$$Ni_aFe_bCo_c \qquad (25)$$

$$Ni_dFe_{100-d} \qquad (26)$$

where $0<a \leq 75$ at %, $0<b \leq 75$ at %, $0<c \leq 75$ at %, and $a+b=100$; and 75 at % $\leq d \leq 85$ at %; and (ii) at least one layer formed of at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and having a thickness falling within a range of between 0.03 nm and 1 nm.

According to another aspect of the present invention, there is provided a magnetoresistive device of a current perpendicular to plane type as described above, wherein the magnetization pinned layer is substantially formed of an alloy represented by general formula (27) or (28) given below:

$$(Fe_aCo_bNi_c)_{100-x}M_x \qquad (27)$$

$$(Fe_dCo_{100-d})_{100-x}M_x \qquad (28)$$

where $0<a \leq 75$ at %, $0<b \leq 75$ at %, $0<c \leq 75$ at %, and $a+b=100$; 45 at % $\leq d \leq 55$ at %; and M is at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and 0.1 at % $\leq x \leq 20$ at %, and wherein the magnetization free layer is substantially formed of an alloy represented by general formula (29) or (30) given below:

$$(Ni_eFe_fCo_g)_{100-x}M_x \qquad (29)$$

$$(Ni_hFe_{100-h})_{100-x}M_x \qquad (30)$$

where 60 at % $\leq e \leq 75$ at %, 12.5 at % $\leq f \leq 20$ at %, 12.5 at % $\leq g \leq 20$ at %, and $e+f+g=100$; 75 at % $\leq h \leq 85$ at %; and M is at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and 0.1 at % $\leq x \leq 20$ at %.

According to another aspect of the present invention, there is provided a magnetoresistive device of a current perpendicular to plane type as described above, wherein the magnetization pinned layer has a laminate structure comprising alternately laminated layers of: (i) at least one layer substantially formed of an alloy represented by general formula (31) or (32) given below:

$$Fe_aCo_bNi_c \qquad (31)$$

$$Fe_dCo_{100-d} \qquad (32)$$

where $0<a \leq 75$ at %, $0<b \leq 75$ at %, $0<c \leq 75$ at %, and $a+b=100$; 45 at % $\leq d \leq 55$ at %; and (ii) at least one layer formed of at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and having a thickness falling within a range of between 0.03 nm and 1 nm, and wherein the magnetization free layer has a laminate structure comprising alternately laminated layers of: (i) at least one layer substantially formed of an alloy represented by general formula (33) or (34) given below:

$$Ni_eFe_fCo_g \qquad (33)$$

$$Ni_hFe_{100-h} \qquad (34)$$

where 60 at % $\leq e \leq 75$ at %, 12.5 at % $\leq f \leq 20$ at %, 12.5 at % $\leq g \leq 20$ at %, and $e+f+g=100$; 75 at % $\leq h \leq 85$ at %; and (ii) at least one layer formed of at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and having a thickness falling within a range of between 0.03 nm and 1 nm.

A magnetic head according to one aspect of the present invention comprises any of the magnetoresistive devices described above.

A magnetic recording-reproducing apparatus according to one aspect of the present invention comprises a magnetic recording medium, and any of the magnetoresistive devices described above.

BRIEF DESCRIPTION OF THE SEVERAL VIEWS OF THE DRAWING

FIG. 14 is a cross sectional view showing the configuration of a current perpendicular to plane type magnetoresistive device according to the fourteenth embodiment of the present invention;

FIG. 15 is a cross sectional view showing the configuration of a current perpendicular to plane type magnetoresistive device according to the fifteenth embodiment of the present invention;

FIG. 20 is a phase diagram showing the composition region of an Fe—Co—Ni alloy forming the body-centered cubic crystal structure;

FIG. 21 is a phase diagram showing the composition region of a Co—Mn—Fe alloy forming the body-centered cubic crystal structure.

DETAILED DESCRIPTION OF THE INVENTION

Figure 1:
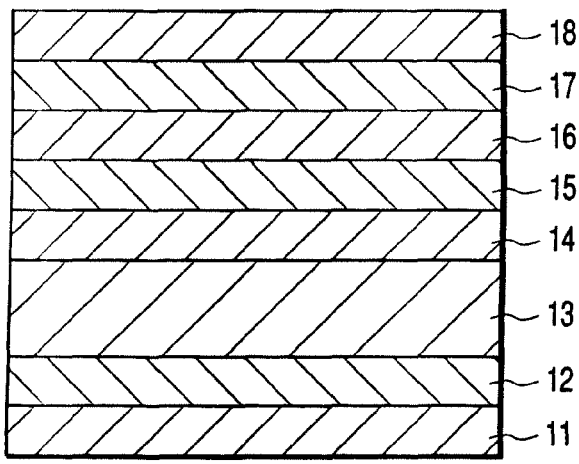
FIG. 1 is a cross sectional view showing a current perpendicular to plane type magnetoresistive device according to one embodiment of the present invention.

FIG. 1 is a cross sectional view showing a magnetoresistive device according to one embodiment of the present invention. The magnetoresistive device shown in FIG. 1 comprises the lower electrode 11, the underlayer 12, the antiferromagnetic layer 13, the magnetization pinned layer 14, the nonmagnetic intermediate layer 15, the magnetization free layer 16, the protective layer 17, and the upper electrode 18. The magnetoresistive film is held between the lower electrode 11 and the upper electrode 18, and a sense current is allowed to flow in a direction perpendicular to the film plane.

Figure 2:
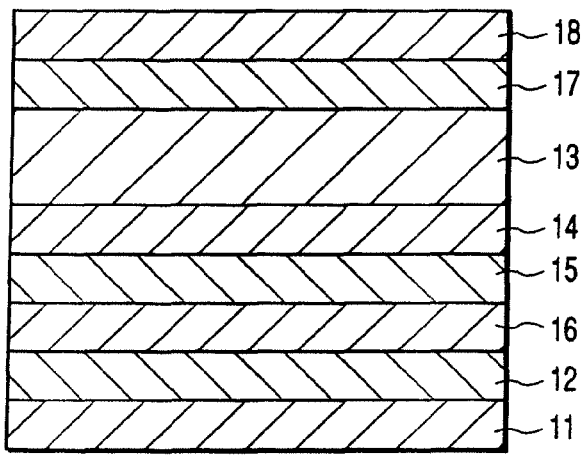
FIG. 2 is a cross sectional view showing a current perpendicular to plane type magnetoresistive device according to another embodiment of the present invention.

It is possible to reverse the laminating order of the antiferromagnetic layer 13, the magnetization pinned layer 14, the nonmagnetic layer 15 and the magnetization free layer 16, which are shown in FIG. 1 and collectively form the magnetoresistive film, as shown in FIG. 2. The configuration in which the antiferromagnetic layer 13 is arranged to form the lowermost layer of the magnetoresistive film as shown in FIG. 1 is called a bottom type spin valve. On the other hand, the configuration in which the antiferro-magnetic layer 13 is arranged to form the uppermost layer of the magnetoresistive film as shown in FIG. 2 is called a top type spin valve.

Figure 3:
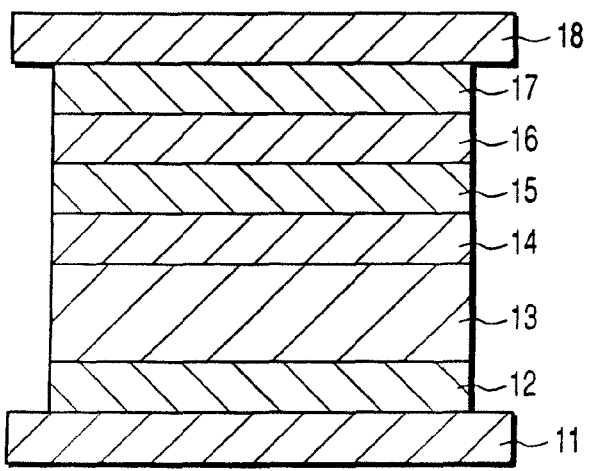
FIG. 3 is a cross sectional view showing a current perpendicular to plane type magnetoresistive device according to another embodiment of the present invention.
Figure 4:
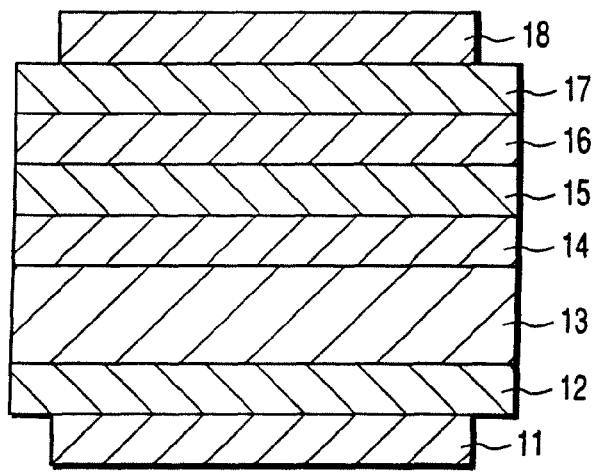
FIG. 4 is a cross sectional view showing a current perpendicular to plane type magnetoresistive device according to another embodiment of the present invention.

It is possible for each of the lower electrode 11 and the upper electrode 18 to have an area larger than that of the magnetoresistive film, as shown in FIG. 3. Alternatively, it is possible for each of the lower electrode 11 and the upper electrode 18 to have an area smaller than that of the magnetoresistive film, as shown in FIG. 4. Further, it is possible for the upper electrode 18 and the lower electrode 11 to differ from each other in the area. In addition to the configurations shown in FIGS. 1 to 4, various configurations are conceivable in respect of the magnetoresistive device.

In the magnetoresistive device having the configuration described above, what is involved in the magnetoresistance effect is the magnetization pinned layer, the magnetization free layer and the interfaces between each of the ferromagnetic layers and the nonmagnetic intermediate layer. In order to increase an output, i.e., an absolute value of a magnetoresistance change, so as to manufacture a magnetoresistive device capable of withstanding the practical use, it is effective to optimize the material selection of these portions.

Figure 5:
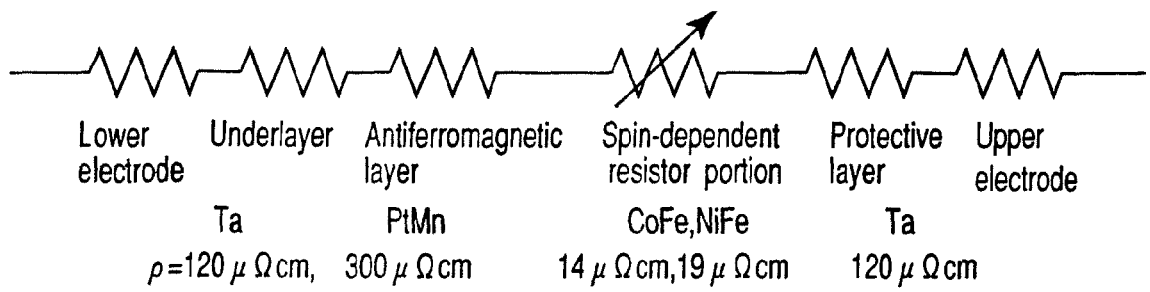
FIG. 5 is an illustration showing a resistance of each portion of a current perpendicular to plane type magnetoresistive device.

To be more specific, FIG. 5 shows the resistance in each portion of the current perpendicular to plane type magnetoresistive device. In the current perpendicular to plane type device, the resistance of the electrodes, the resistance of the underlayer, the resistance of the antiferromagnetic layer, etc., are connected in series. Tantalum (Ta) generally used for the underlayer has a resistivity of about 120 μΩ cm, and the IrMn or PtMn used for the antiferromagnetic layer has a resistivity of about 300 μΩ cm. On the other hand, $Co_{90}Fe_{10}$ generally used for each of the magnetization pinned layer and the magnetization free layer has a resistivity of about 14 μΩ cm, and $Ni_{80}Fe_{20}$ has a resistivity of about 19 μΩ cm. In short, the magnetization pinned layer and the magnetization free layer exhibit the resistivity about (1/10) the value for the underlayer and the antiferromagnetic layer. In addition, the resistance of the electrodes and a parasitic resistance such as a contact resistance produce effects in the case of a two-terminal device. Such being the situation, it is necessary to increase the magnetoresistance change in the portion dependent on spin in order to prevent the change from being hidden in the background resistance.

In the magnetoresistive device of the embodiments of the present invention, the materials of the magnetization pinned layer and the magnetization free layer, which exhibit a spin-dependent resistance, are selected appropriately so as to provide a high output.

Two types of magnetoresistive devices are manufactured in the following specific embodiments of the present invention so as to evaluate the effects of the devices.

Figure 17:
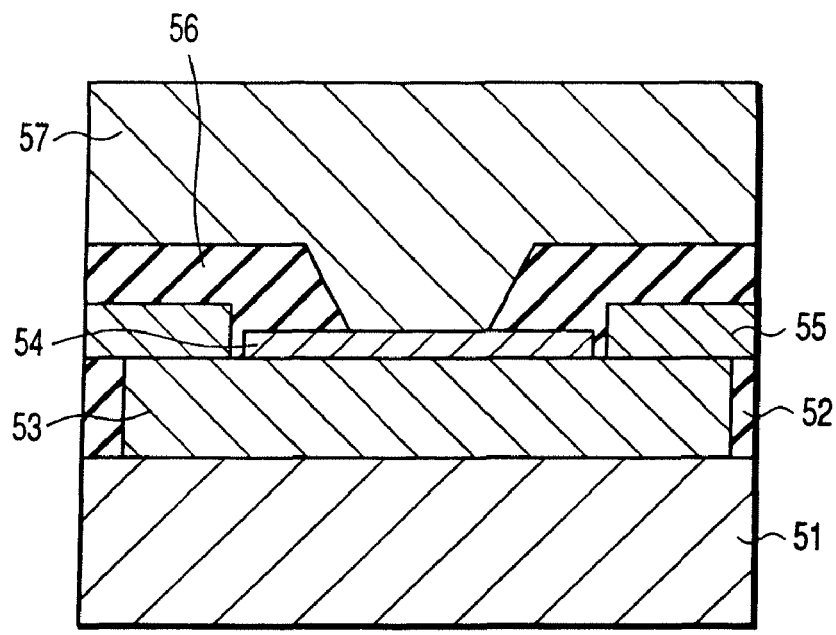
FIG. 17 is a cross sectional view showing the specific configuration of a current perpendicular to plane type magnetoresistive device according to one embodiment of the present invention.

FIG. 17 shows the configuration of a first magnetoresistive device. The device is manufactured as follows. In the first step, the $AlO_x$ film 52 is formed in a thickness of about 500 nm on the Si substrate 51, followed by coating the $AlO_x$ film 52 with a resist and subsequently removing, by means of PEP, that portion of the resist where a lower electrode is to be formed. That portion of the $AlO_x$ film 52 not covered with the resist is removed by reactive ion etching (RIE), followed by removing the resist. A laminate structure of [5 nm Ta/400 nm Cu/20 nm Ta] is deposited to form the lower electrode 53. The surface of the lower electrode 53 is planarized by means of chemical mechanical polishing (CMP). The spin valve film 54 is processed in a size of about 3×3 μm to 5×5 μm on the lower electrode 53, followed by forming the CoPt hard film 55 having a thickness of about 30 nm on the both sides of the spin valve film 54. The $SiO_2$ film 56 is formed in a thickness of about 200 nm as a passivation film on the entire surface. After formation of a resist, the resist is removed from the contact hole-forming region in the central portion of the spin valve film 54. Then, a contact hole with a diameter of about 0.3 μm Φ to 3 μm Φ is formed by means of RIE and milling, followed by removing the resist. Further, the upper electrode 57 of a laminate structure of [5 nm Ta/400 nm Cu/5 nm Ta], and an Au pad (not shown) having a thickness of about 200 nm film are subsequently formed.

Figure 18:
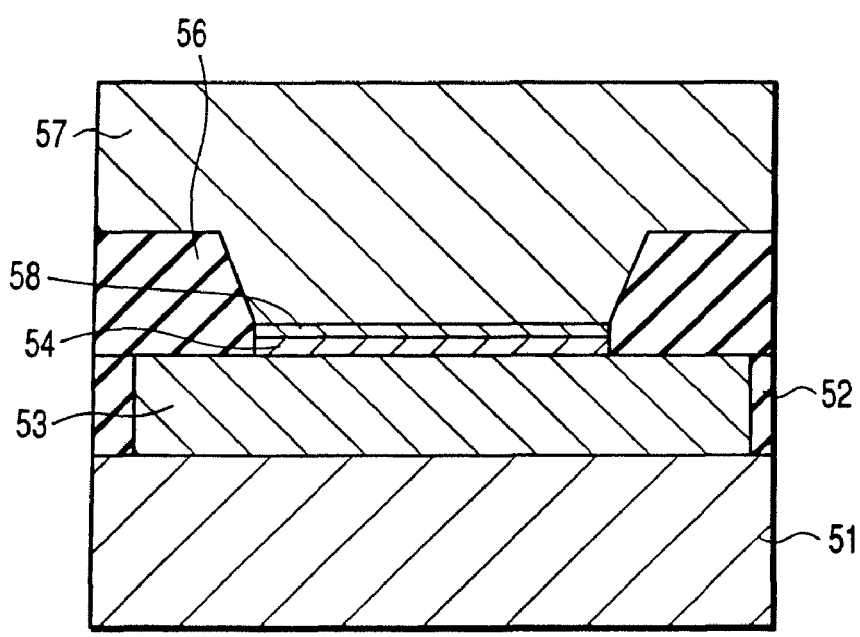
FIG. 18 is a cross sectional view showing the specific configuration of a current perpendicular to plane type magnetoresistive device according to another embodiment of the present invention.

FIG. 18 shows the configuration of a second magnetoresistive device. As in the process of manufacturing the magnetoresistive device shown in FIG. 17, the $AlO_x$ film 52 is formed on the Si substrate 51, followed by partly removing the $AlO_x$ film 52 and subsequently forming the lower electrode 53, the surface of which is planarized by CMP. The spin valve film 54 is formed on the lower electrode 53, followed by processing the spin valve film 54 in a stripe pattern having a width of about 2 μm to 5 μm. The $SiO_x$ film 54 is formed in a thickness of about 200 nm as a passivation film on the entire surface. The $SiO_x$ film 56 is coated with a resist, followed by removing that region of the resist having a width of about 1.5 μm to 5 μm in a direction perpendicular to the longitudinal direction of the spin valve film 54 so as to define the size of the device. After removal of the resist, the Au film 58 is formed in a thickness of about 100 nm right above the spin valve film 54 so as to permit a sense current to flow uniformly in the spin valve film 54. Then, the upper electrode 57 and a pad are formed as in the device shown in FIG. 17.

Resistance characteristics of the first and second magnetoresistive devices are measured by employing a four-probe method. It has been found that there is no difference in the output between the first and second devices. A crystal structure is analyzed by using a Cu—Kα ray. Morphology is observed with a cross sectional TEM. Composition distribution is examined by n-EDX. An electron state of a specific element contained in the alloy is examined by EXAFS.

[1] An appropriate composition was studied in respect of a ferromagnetic layer forming the magnetization pinned layer and the magnetization free layer. The results of the study were as follows.

First Embodiment

Manufactured were magnetoresistive films including a magnetization pinned layer and a magnetization free layer each formed of a $Co_{100-x}Fe_x$ alloy having a varied Fe concentration. The film configuration was as follows: lower electrode/5 nm-Ta/5 nm-NiFeCr/15 nm-PtMn (antiferromagnetic layer)/7 nm-$Co_{100-x}Fe_x$ (pinned layer)/7 nm-Cu (nonmagnetic intermediate layer)/7 nm-$Co_{100-x}Fe_x$ (free layer)/10 nm-Ta/upper electrode, where the numerals represent the thickness of each film.

The Fe concentration x was changed to 0, 10 atomic %, 20 atomic %, 27 atomic %, 30 atomic %, 40 atomic %, 50 atomic %, 60 atomic %, 70 atomic %, 80 atomic %, 90 atomic % and 100 atomic %, with the thickness of each of the free layer and the pinned layer fixed to 7 nm.

Figure 6:
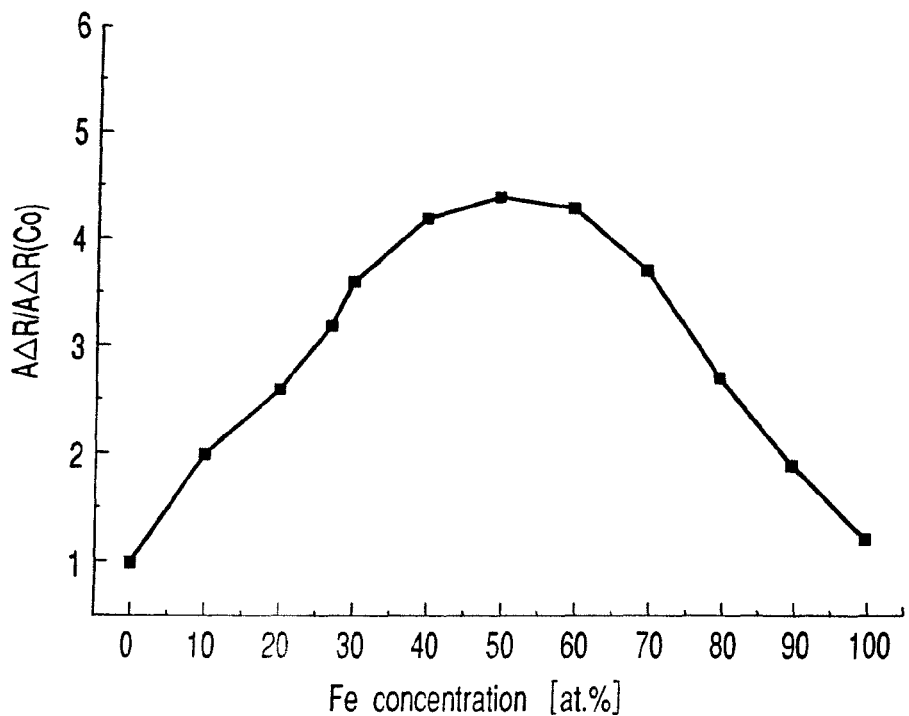
FIG. 6 is a graph showing a relationship between magnetoresistance change and Fe concentration in the case of using a Co—Fe alloy in the current perpendicular to plane type magnetoresistive device according to the first embodiment of the present invention.

FIG. 6 is a graph showing the relationship between resistance change and Fe concentration. The resistance change AΔR per one μm² of device area, which is normalized with the resistance change AΔR (0.5 mΩ μm²) of the device including a free layer and a pinned layer each formed of a pure Co, is plotted on the ordinate of the graph.

As apparent from FIG. 6, the Fe concentration effective for increasing the resistance change AΔR falls within a range of between 25 atomic % and 75 atomic %, more preferably between 40 atomic % and 60 atomic %.

Second Embodiment

Manufactured were magnetoresistive films including a magnetization pinned layer and a magnetization free layer each formed of a $Ni_{100-x}Fe_x$ alloy having a varied Fe concentration. The film configuration was as follows: lower electrode/5 nm-Ta/5 nm-NiFeCr/15 nm-PtMn/7 nm-$Ni_{100-x}Fe_x$/7 nm-Cu/7 nm-$Ni_{100-x}Fe_x$/10 nm-Ta/upper electrode, where the numerals represent the thickness of each film.

The Fe concentration x was changed to 0, 10 atomic %, 20 atomic %, 30 atomic %, 40 atomic %, 50 atomic %, 60 atomic %, 70 atomic %, 80 atomic %, 90 atomic % and 100 atomic %, with the thickness of each of the magnetization free layer and the magnetization pinned layer fixed to 7 nm.

Figure 7:
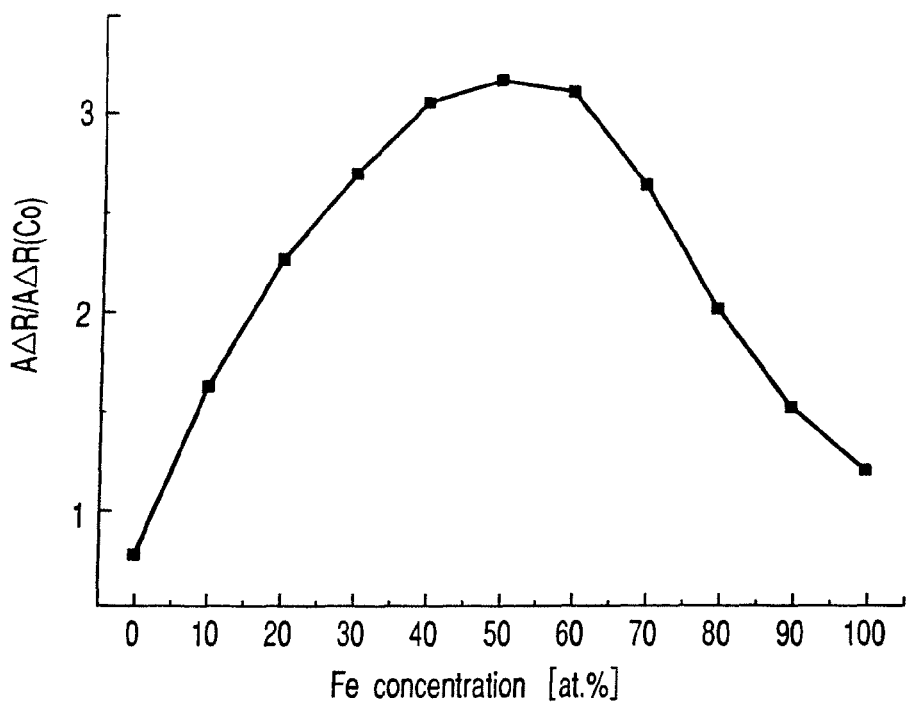
FIG. 7 is a graph showing a relationship between magnetoresistance change and Ni concentration in the case of using a Ni—Fe alloy in the current perpendicular to plane type magnetoresistive device according to the second embodiment of the present invention.

FIG. 7 is a graph showing the relationship between resistance change and Fe concentration. The resistance change AΔR per one μm² of device area, which is normalized with the resistance change AΔR (0.5 mΩ μm²) of the device including a free layer and a pinned layer each formed of a pure Co, is plotted on the ordinate of the graph.

As apparent from FIG. 7, the Fe concentration effective for increasing the resistance change AΔR falls within a range of between 25 atomic % and 75 atomic %, more preferably between 40 atomic % and 60 atomic %.

Third Embodiment

Manufactured were magnetoresistive films including a magnetization pinned layer and a magnetization free layer each formed of a $Ni_{100-x}Co_x$ alloy having a varied Co concentration. The film configuration was as follows: lower electrode/5 nm-Ta/5 nm-NiFeCr/15 nm-PtMn/7 nm-$Ni_{100-x}Co_x$/7 nm-Cu/7 nm-$N_{100-x}Co_x$/10 nm-Ta/upper electrode, where the numerals represent the thickness of each film.

The Co concentration x was changed to 0, 10 atomic %, 20 atomic %, 30 atomic %, 40 atomic %, 50 atomic %, 60 atomic %, 70 atomic %, 80 atomic %, 90 atomic % and 100 atomic %, with the thickness of each of the magnetization free layer and the magnetization pinned layer fixed to 7 nm.

Figure 8:
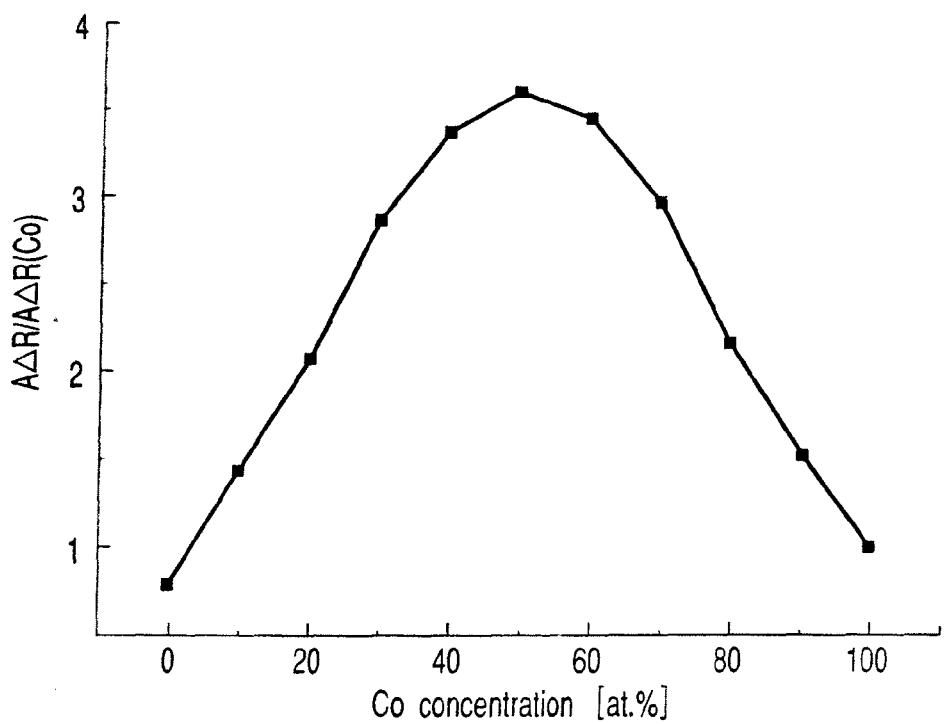
FIG. 8 is a graph showing a relationship between magnetoresistance change and Co concentration in the case of using a Ni—Co alloy in the current perpendicular to plane type magnetoresistive device according to the third embodiment of the present invention.

FIG. 8 is a graph showing a relationship between resistance change and Co concentration. The resistance change AΔR per one μm² of device area, which is normalized with the resistance change AΔR (0.5 mΩ μm²) of the device including a free layer and a pinned layer each formed of a pure Co, is plotted on the ordinate of the graph.

As apparent from FIG. 8, the Co concentration effective for increasing the resistance change AΔR falls within a range of between 25 atomic % and 75 atomic %, more preferably between 40 atomic % and 60 atomic %.

Fourth Embodiment

Manufactured were magnetoresistive films including a magnetization pinned layer and a magnetization free layer each formed of a ternary alloy containing Fe, Co and Ni. The film configuration was as follows: lower electrode/5 nm-Ta/5 nm-NiFeCr/15 nm-PtMn/7 nm-$Fe_xCo_yNi_z$/7 nm-Cu/7 nm-$Fe_xCo_yNi_z$/10 nm-Ta/upper electrode, where the numerals represent the thickness of each film.

Figure 9:
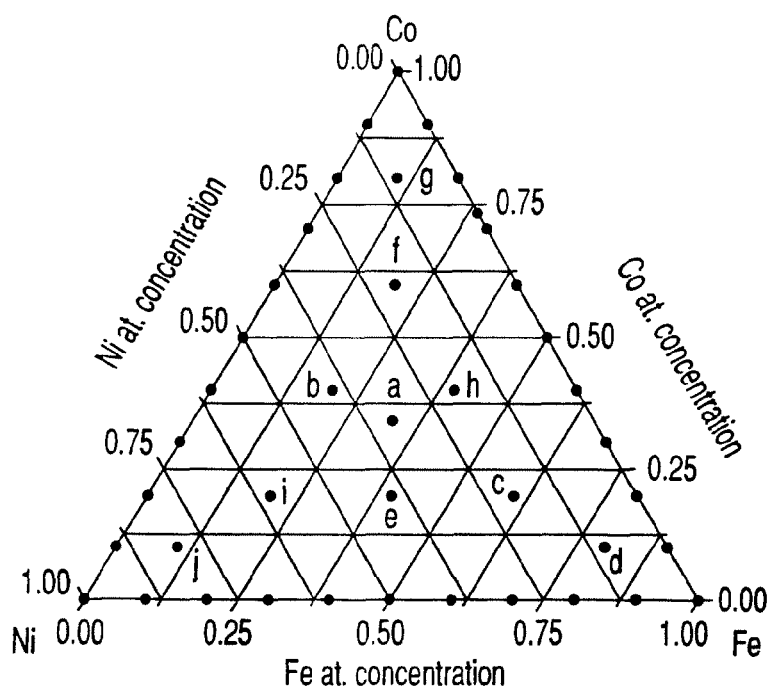
FIG. 9 shows measuring points of the magnetoresistance change in the case of using a Co—Fe—Ni ternary alloy in the current perpendicular to plane type magnetoresistive device according to the fourth embodiment of the present invention.

The composition of the ternary alloy was changed into cases "a" to "j" shown in FIG. 9, with the thickness of each of the magnetization free layer and the magnetization fixed layer fixed to 7 nm. FIG. 9 also shows the compositions of the alloys studied in Examples 1 to 3. Table 1 shows the compositions of the ternary alloys used for forming the magnetization fixed layer and the magnetization free layer and the normalized resistance change, i.e., the value of AΔR (ternary alloy)/AΔR (pure Co).

TABLE 1

|   | Composition (Fe, Co, Ni) | AΔR (ternary alloy) / AΔR (pure Co) |
|---|---|---|
| a | (33%, 34%, 33%) | 6 |
| b | (20%, 40%, 40%) | 5.3 |
| c | (60%, 20%, 20%) | 5 |
| d | (80%, 10%, 10%) | 3.7 |
| e | (40%, 20%, 40%) | 5.5 |
| f | (20%, 60%, 20%) | 5 |
| g | (10%, 80%, 10%) | 3.5 |
| h | (40%, 40%, 20%) | 5.4 |
| i | (20%, 20%, 60%) | 4.3 |
| j | (10%, 10%, 80%) | 2.3 |

Figure 10A:
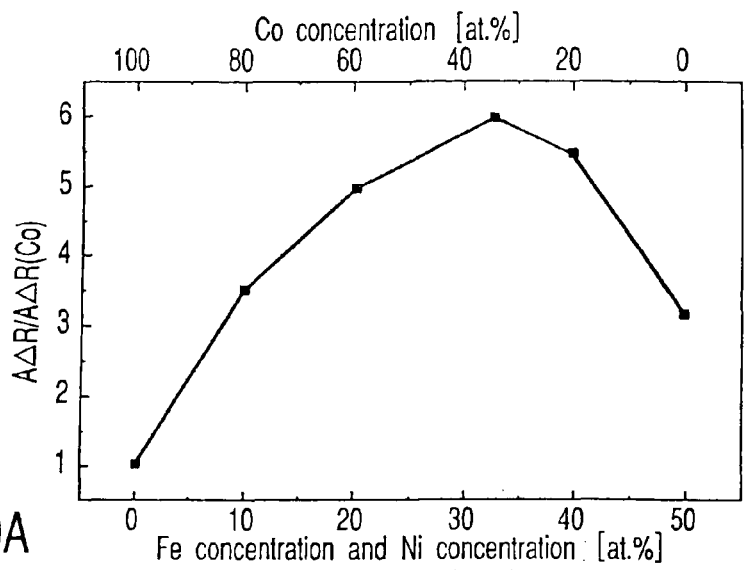
FIGS. 10A to 10C show a relationship between alloy composition shown in FIG. 9 and magnetoresistance change, respectively.
Figure 10B:
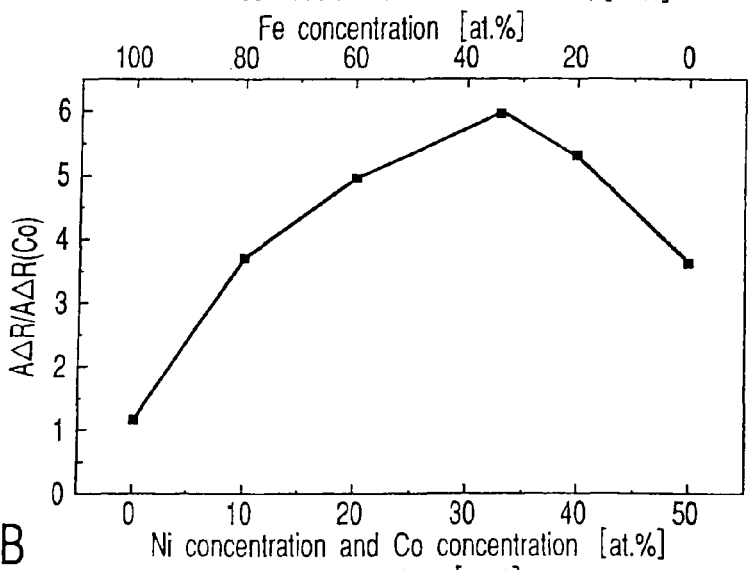
Figure 10C:
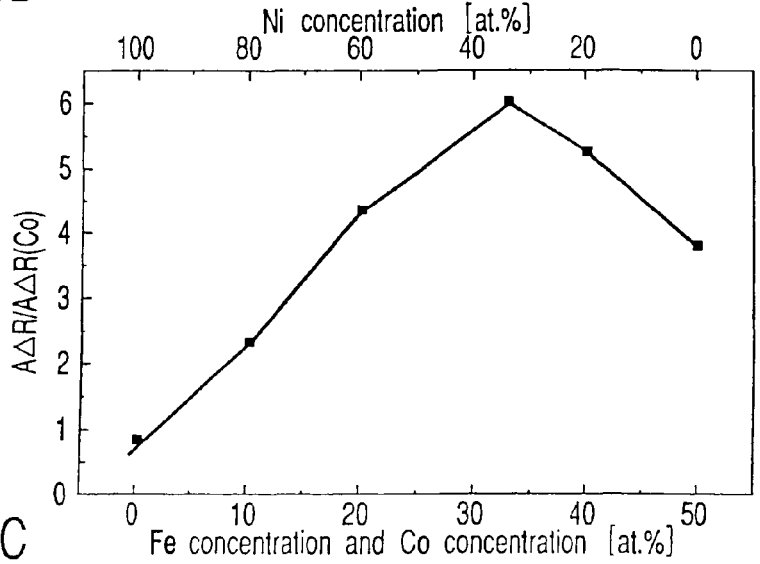

FIGS. 10A to 10C are graphs showing a relationship between alloy composition and magnetoresistance change, where the alloy compositions are varied in such a manner that the compositions of two elements selected from Fe, Co and Ni are set to the same atomic % and varied from 0 to 50 atomic %, while the composition of the another element is varied from 100 to 0 atomic %. FIG. 10A is a graph showing a relationship between alloy composition and magnetoresistance change along the line of pure Co-g-f-a-e-$Ni_{50}Fe_{50}$ shown in FIG. 9. FIG. 10B is a graph showing a relationship between alloy composition and magnetoresistance change along the line of pure Fe-d-d-a-b-$Ni_{50}Co_{50}$ shown in FIG. 9. FIG. 10C is a graph showing a relationship between alloy composition and magnetoresistance change along the line of pure Ni-j-i-a-h-$Fe_{50}Co_{50}$ shown in FIG. 9.

As can be seen form FIGS. 10A to 10C, the largest magnetoresistance change can be obtained in the vicinity of a region where compositions of three elements are set to almost same atomic %. As the composition of an alloy deviates the region where compositions of three elements are set to almost same atomic %, the magnetoresistance change decreases. In a region where Ni composition is high in FIG. 10C, the rate of decrease in magnetoresistance change is high. According to the above results, it is effective to set the alloy composition so as to meet a≦75 atomic %, b≦75 atomic % and c≦63 atomic % in order to obtain a large magnetoresistance change in a $Fe_aCo_bNi_c$ ternary alloy. In addition, it is preferable that a $Fe_aCo_bNi_c$ ternary alloy has a composition of a≧25 atomic %, b≧25 atomic % and c≧25 atomic %.

[2] In the embodiments described in the following, the ferromagnetic layer used for the magnetization pinned layer and the magnetization free layer was prepared by using alloys containing Fe, Co or Ni and an additive element.

Fifth Embodiment

Manufactured were magnetoresistive films including a magnetization pinned layer and a magnetization free layer each formed of an alloy prepared by adding Cu to $Fe_{50}Co_{50}$. The film configuration was as follows: lower electrode/5 nm-Ta/5 nm-NiFeCr/15 nm-PtMn/7 nm-$(Co_{0.5}Fe_{0.5})_{100-y}Cu_y$/7 nm-Cu/7 nm-$(Co_{0.5}Fe_{0.5})_{100-y}Cu_y$/10 nm-Ta/upper electrode, where the numerals represent the thickness of each film.

The Cu addition amount y was changed to 0 atomic %, 0.5 atomic %, 2 atomic %, 5 atomic %, 10 atomic %, 15 atomic %, 20 atomic %, 30 atomic % and 40 atomic %, with the thickness of each of the magnetization free layer and the magnetization pinned layer fixed to 7 nm.

Figure 11:
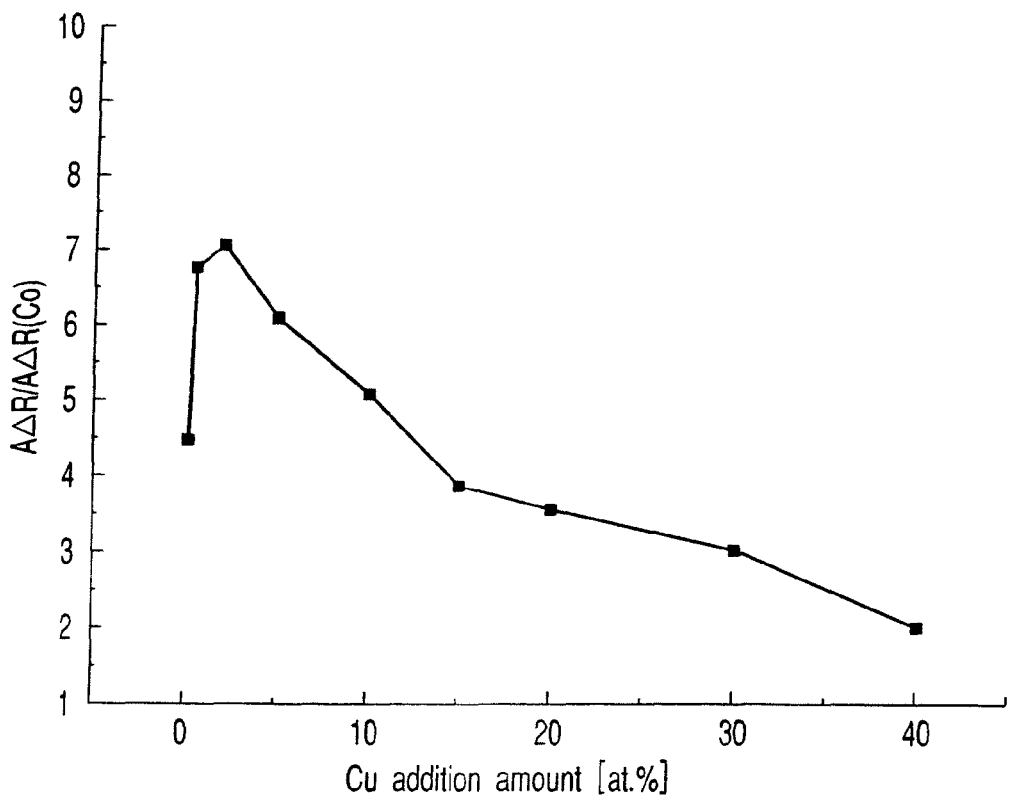
FIG. 11 is a graph showing a relationship between magnetoresistance change and Cu concentration in a $Co_{50}Fe_{0.50}$ alloy containing Cu in the current perpendicular to plane type magnetoresistive device according to the fifth embodiment of the present invention.

FIG. 11 is a graph showing a relationship between resistance change and Cu addition amount. The resistance change AΔR per one μm² of device area, which is normalized with the resistance change AΔR (0.5 mΩ μm²) of the device including a magnetization free layer and a magnetization pinned layer each formed of a pure Co, is plotted on the ordinate of the graph.

As apparent from FIG. 11, the Cu addition amount effective for increasing the resistance change AΔR is not larger than 20 atomic %, preferably not larger than 5 atomic %.

Additional experiments were conducted by changing the kinds of the additive elements and the addition amounts to $Co_{50}Fe_{50}$ for preparing the alloys used for the magnetization pinned layer and the magnetization free layer. The resistance change, which was normalized with the resistance change in the case where each of the magnetization free layer and the magnetization pinned layer was formed of a pure Co, was found to be 2 times for 1 atomic % of Cr, 2 times for 1 atomic % of V, 3 times for 5 atomic % of Zn, 3 times for 2 atomic % of Ga, 3 times for 2 atomic % of Sc, 3 times for 2 atomic % of Ti, 2 times for 2 atomic % of Mn, and 3 times for 2 atomic % of Hf. Clearly, these additive elements have been found to be effective for increasing the resistance change. These additive elements are effective in the case where the addition amount falls within a range of between 0.1 atomic % and 30 atomic %, preferably where the addition amount is not larger than 10 atomic %. It has also been found that, in the case of adding Ni in an amount not larger than 5 atomic %, the value of normalized AΔR is rendered 5.5 times.

Likewise, increase in magnetoresistance change was recognized in the case of using Ta, Nb, Ge, Zr, Y, Tc, Re, Ru, Rh, Ir, Pd, Pt, Ag, Au, B, Al, In, C, Si, Sn, Ca, Sr or Ba as the additive element.

The effect of increasing the magnetoresistance change produced by the use of the additive element was similarly recognized in the case of using any of a Co—Fe binary alloy, a Ni—Fe binary alloy, a Ni—Co binary alloy and a Fe—Co—Ni ternary alloy as well as the $Co_{50}Fe_{50}$ alloy.

Sixth Embodiment

Manufactured were magnetoresistive films including a magnetization pinned layer and a magnetization free layer each formed of an alloy prepared by adding additive elements to Fe. The film configuration was as follows: lower electrode/5 nm-Ta/5 nm-NiFeCr/15 nm-PtMn/7 nm-Fe$_{100-x}$ M$_x$/7 nm-Cu/7 nm-Fe$_{100-x}$ M$_x$/10 nm-Ta/upper electrode, where the numerals represent the thickness of each film.

The addition amount x of the additive element M was changed to 0 atomic %, 5 atomic %, 10 atomic %, 15 atomic %, 20 atomic %, 30 atomic % and 40 atomic %, with the thickness of each of the magnetization free layer and the magnetization pinned layer fixed to 7 nm.

It has been found that, in the case of using Cu as the additive element, the addition amount effective for increasing the resistance change AΔR falls within a range of between 0.5 atomic % and 30 atomic %, preferably is not larger than 20 atomic %.

Additional experiments were conducted by changing the kinds of the additive elements and the addition amounts to Fe for preparing the alloys used for the magnetization pinned layer and the magnetization free layer. The normalized resistance change was found to be 1.5 times for 3 atomic % of Zn, and 1.5 times for 2 atomic % of Ga. Clearly, these additive elements have been found to be effective for increasing the resistance change. These additive elements are effective in the case where the addition amount falls within a range of between 0.1 atomic % and 30 atomic %, preferably where the addition amount is not larger than 10 atomic %. It has also been found that, in the case of adding Ni in an amount falling within a range of between 0.1 atomic % and 5 atomic %, the value of normalized AΔR is rendered 1.3 times.

Likewise, increase in the magnetoresistance change was recognized in the case of using Cr, V, Ta, Nb, Sc, Ti, Mn, Ge, Zr, Y, Tc, Re, Ru, Rh, Ir, Pd, Pt, Ag, Au, B, Al, In, C, Si, Sn, Ca, Sr or Ba as the additive element in an amount not larger than about 30 atomic %.

The effect of increasing the resistance change produced by the use of the additive element was similarly recognized in the case of using a Fe-based alloy, i.e., alloy containing at least 50 atomic % of Fe, as well as pure Fe.

Seventh Embodiment

Manufactured were magnetoresistive films including a magnetization pinned layer and a magnetization free layer each formed of an alloy prepared by adding additive elements to Co. The film configuration was as follows: lower electrode/5 nm-Ta/5 nm-NiFeCr/15 nm-PtMn/7 nm-Co$_{100-x}$ M$_x$/7 nm-Cu/7 nm-Co$_{100-x}$ M$_x$/10 nm-Ta/upper electrode, where the numerals represent the thickness of each film.

The addition amount x of the additive element M was changed to 0 atomic %, 5 atomic %, 10 atomic %, 15 atomic %, 20 atomic %, 30 atomic % and 40 atomic %, with the thickness of each of the magnetization free layer and the magnetization pinned layer fixed to 7 nm.

The normalized resistance change was found to be 1.3 times for 5 atomic % of Sc, 1.8 times for 2 atomic % of Ti, 1.4 times for 2 atomic % of Mn, 1.6 times for 2 atomic % of Cu, and 2 times for 2 atomic % of Hf. Clearly, these additive elements have been found to be effective for increasing the resistance change. These additive elements are effective in the case where the addition amount falls within a range of between 0.5 atomic % and 30 atomic %, preferably where the addition amount is not larger than 10 atomic %.

It has also been found that, in the case of adding each of Fe and Ni in an amount not larger than 5 atomic %, the value of normalized AΔR is rendered 1.5 times and 1.3 times, respectively.

Likewise, increase in magnetoresistance change was recognized in the case of using Cr, V, Ta, Nb, Zn, Ga, Ge, Zr, Y, Tc, Re, Ru, Rh, Ir, Pd, Pt, Ag, Au, B, Al, In, C, Si, Sn, Ca, Sr or Ba as the additive element in an amount falling within a range of between 0.1 atomic % and 30 atomic %.

The effect of increasing the resistance change produced by the use of the additive element was similarly recognized in the case of using a Co-based alloy, i.e., alloy containing at least 50 atomic % of Co, as well as pure Co.

Eighth Embodiment

Manufactured were magnetoresistive films including a magnetization pinned layer and a magnetization free layer each formed of an alloy prepared by adding additive elements to Ni. The film configuration was as follows: lower electrode/5 nm-Ta/5 nm-NiFeCr/15 nm-PtMn/7 nm-Ni$_{100-x}$ M$_x$/7 nm-Cu/7 nm-Ni$_{100-x}$ M$_x$/10 nm-Ta/upper electrode, where the numerals represent the thickness of each film.

The addition amount x of the additive element M was changed to 0 atomic %, 5 atomic %, 10 atomic %, 15 atomic %, 20 atomic %, 30 atomic % and 40 atomic %, with the thickness of each of the magnetization free layer and the magnetization pinned layer fixed to 7 nm.

The normalized resistance change was found to be 1.3 times for 5 atomic % of Ti, 1.5 times for 2 atomic % of Mn, 1.2 times for 2 atomic % of Zn, 1.5 times for 2 atomic % of Ga, 1.4 times for 2 atomic % of Zr, and 1.5 times for 2 atomic % of Hf. Clearly, these additive elements have been found to be effective for increasing the resistance change. These additive elements are effective in the case where the addition amount falls within a range of between 0.1 atomic % and 30 atomic %, preferably where the addition amount is not larger than 10 atomic %.

It has also been found that, in the case of adding each of Fe and Co in an amount not larger than 5 atomic %, the value of normalized AΔR is rendered 1.2 times and 1.1 times, respectively.

Likewise, an increase in the amount of change in magnetoresistance was recognized in the case of using Cr, V, Ta, Nb, Sc, Cu, Y, Tc, Re, Ru, Rh, Ir, Pd, Pt, Ag, Au, B, Al, In, C, Si, Sn, Ca, Sr or Ba as the additive element in an amount falling within a range of between 0.5 atomic % and 30 atomic %.

Ninth Embodiment

The effect of increasing the magnetoresistance change produced by the use of the additive element was similarly recognized in the case of using a Ni-based alloy, i.e., alloy containing at least 50 atomic % of Ni, as well as pure Ni.

Manufactured were magnetoresistive films including a magnetization pinned layer and a magnetization free layer each formed of an alloy prepared by adding additive elements to Ni$_{80}$Fe$_{20}$ or Ni$_{66}$Fe$_{16}$Co$_{18}$. The film configuration was as follows:

(i) lower electrode/5 nm-Ta/5 nm-NiFeCr/15 nm-PtMn/7 nm-(Ni$_{80}$Fe$_{20}$)$_{100-x}$M$_x$/7 nm-Cu/7 nm-(Ni$_{80}$Fe$_{20}$)$_{100-x}$M$_x$/10 nm-Ta/upper electrode, and (ii) lower electrode/5 nm-Ta/5 nm-NiFeCr/15 nm-PtMn/7 nm-(Ni$_{66}$Fe$_{16}$Co$_{18}$)$_{100-x}$ M$_x$/7 nm-Cu/7 nm-(Ni$_{66}$Fe$_{16}$Co$_{18}$)$_{100-x}$M$_x$/10 nm-Ta/upper electrode.

The addition amount x of the additive element M was changed to 0 atomic %, 5 atomic %, 10 atomic %, 15 atomic %, 20 atomic %, 30 atomic % and 40 atomic %, with the thickness of each of the magnetization free layer and the magnetization pinned layer fixed to 7 nm.

The normalized resistance change in the devices having the above film configuration (i) found to be 2.5 times for 0 atomic % of M, 3 times for 5 atomic % of Zn, 2.8 times for 2 atomic % of Ti, 2.9 times for 2 atomic % of Mn, 4 times for 2 atomic % of Cu, 4 times for 2 atomic % of Hf, 4 times for Ga, 3 times for Ge, and 4 times for Zr.

The normalized resistance change in the devices having the above film configuration (ii) found to be 3.5 times for 0 atomic % of M, 4 times for 5 atomic % of Zn, 4 times for 2 atomic % of Ti, 4 times for 2 atomic % of Mn, 4 times for 2 atomic % of Cu, 4.5 times for 2 atomic % of Hf 4.5 times for 2 atomic % of Ga, 3.9 times for 2 atomic % of Ge, and 4 times for 2 atomic % of Zr.

Clearly, these additive elements have been found to be effective for increasing the resistance change. These additive elements are effective in the case where the addition amount falls within a range of between 0.1 atomic % and 30 atomic %, preferably where the addition amount is not larger than 10 atomic %.

Likewise, an increase in the amount of change in magnetoresistance was recognized in the case of using Cr, V, Ta, Nb, Sc, Y, Tc, Re, Ru, Rh, Ir, Pd, Pt, Ag, Au, B, Al, In, C, Si, Sn, Ca, Sr or Ba as the additive element in an amount falling within a range of between 0.1 atomic % and 30 atomic %.

In each of the fifth to ninth embodiments described above, it is possible to prepare the alloy by adding traces of the additive element to the base metal, and then allowing the additive element to diffuse into the base metal. However, it is more desirable to prepare a target in conformity with a desired composition in view of controllability as well as improvement in the film quality such as crystallinity. Also, a large effect is produced in the case where the additive element is dissolved in the base metal because the band structure of the alloy is changed in this case. However, a reasonable effect can be produced even if the additive element is precipitated from the base phase because the state is changed in the interfacial region between the base phase and the precipitated phase. Further, the produced effect can be increased if the concentration of the additive element is modulated.

[3] The effect of increasing the resistance change based on the crystal structure of each of the magnetization pinned layer and the magnetization free layer has been studied, with the results as described in the following.

Tenth Embodiment

Increase in magnetoresistance change can also be obtained in the case where each of the magnetization pinned layer and the magnetization free layer has a body-centered cubic crystal structure (bcc structure).

The effect of increasing the magnetoresistance change produced by the bcc structure has also been confirmed in the case where a magnetic material other than the Fe—Co—Ni-based alloy is used for the magnetization pinned layer and the magnetization free layer.

[4] Modifications of the embodiments described under items [1], [2] and [3] given above will now be described.

Eleventh Embodiment

The effect of increasing the magnetoresistance change has been produced by adjusting appropriately the composition and the crystal structure of each of the magnetization pinned layer and the magnetization free layer even in the top type spin valve in which the antiferromagnetic layer is arranged in an upper portion as shown in FIG. 2.

Twelfth Embodiment

Figure 12:
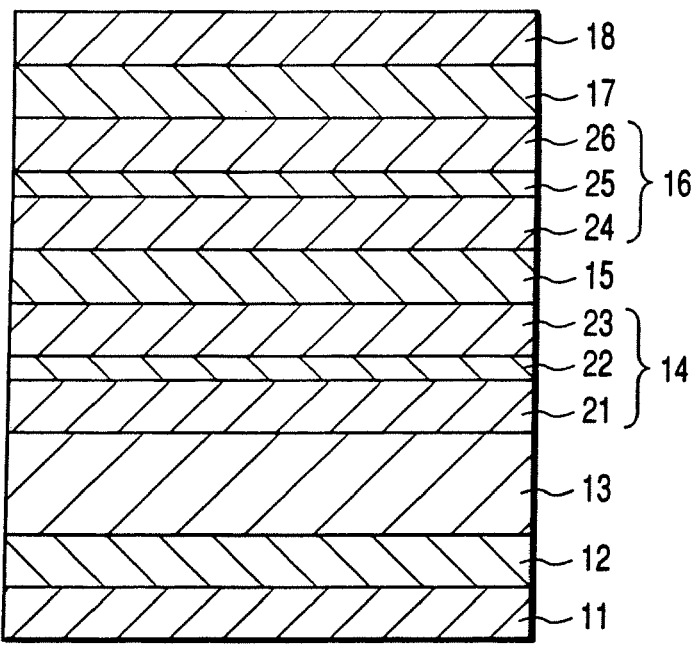
FIG. 12 is a cross sectional view showing the configuration of a current perpendicular to plane type magnetoresistive device according to the twelfth embodiment of the present invention.

FIG. 12 shows the configuration of a magnetoresistive device of a stacked ferrimagnetic structure. The magnetoresistive device shown in FIG. 12 comprises the lower electrode 11, the underlayer 12, the antiferromagnetic layer 13, the magnetization pinned layer 14 of a three-layered structure comprising the magnetization pinned layer 21, the antiparallel coupling layer 22 and the magnetization pinned layer 23, the nonmagnetic intermediate layer 15, the magnetization free layer 16 of a three-layered structure comprising the magnetization free layer 24, the antiparallel coupling layer 25 and the magnetization free layer 26, the protective layer 17, and the upper electrode 18. Even in the magnetoresistive device of the stacked ferrimagnetic structure described above, the effect of increasing the magnetoresistance change has been produced by adjusting appropriately the composition and the crystal structure of each of the magnetization pinned layer and the magnetization free layer.

Also, only one of the magnetization pinned layer and the magnetization free layer may have a stacked ferrimagnetic structure. The following description covers the case where the magnetization pinned layer alone has a stacked ferrimagnetic structure. The particular magnetoresistive device comprises the lower electrode 11, the underlayer 12, the antiferromagnetic layer 13, the magnetization pinned layer 21, the antiparallel coupling layer 22, the magnetization pinned layer 23, the nonmagnetic intermediate layer 15, the magnetization free layer 24, the protective layer 17, and the upper electrode 18. Specifically, prepared were magnetoresistive device samples A to D given below:

Sample A: lower electrode/5 nm-Ta/5 nm-NiFeCr/15 nm-PtMn/7 nm-$(Fe_{0.5}Co_{0.5})_{99}Cu_1$/1 nm-Ru/7 nm-$(Fe_{0.5}Co_{0.5})_{99}Cu_1$/7 nm-Cu/7 nm-$(Fe_{0.5}Co_{0.5})_{99}Cu_1$/10 nm-Ta/upper electrode.

Sample B: lower electrode/5 nm-Ta/5 nm-NiFeCr/15 nm-PtMn/7 nm-$Ni_{80}Fe_{20}$/1 nm-Ru/7 nm-$(Fe_{0.5}Co_{0.5})_{99}Cu_1$/-7 nm-Cu/7 nm-$(Fe_{0.5}Co_{0.5})_{99}Cu_1$/10 nm-Ta/upper electrode.

Sample C: lower electrode/5 nm-Ta/5 nm-NiFeCr/15 nm-PtMn/7 nm-$(Fe_{0.5}Co_{0.5})_{99}Cu_1$/1 nm-Ru/7 nm-$(Fe_{0.5}Co_{0.5})_{99}Cu_1$/7 nm-Cu/7 nm-$Co_{50}Fe_{50}$/10 mn-Ta/upper electrode.

Sample D: lower electrode/5 nm-Ta/5 nm-NiFeCr/15 nm-PtMn/7 nm-$(Fe_{0.5}Co_{0.5})_{99}Cu_1$/1 nm-Ru/7 nm-$(Fe_{0.5}Co_{0.5})_{99}Cu_1$/7 nm-Cu/7 nm-$Co_{90}Fe_1$0/10 nm-Ta/upper electrode.

The value of normalized A$\Delta$R for sample B was increased to a level about 1.4 times as high as that for sample A. The reason for the particular phenomenon will now be discussed briefly.

Among the laminated films constituting the magnetoresistive device, the active portion contributing to the magnetoresistance change include the magnetization free layer 24, the nonmagnetic intermediate layer 15 and the magnetization pinned layer 23 in contact with the nonmagnetic intermediate layer 15. The magnetization pinned layer 21, which is not in contact with the nonmagnetic intermediate layer 15, does not contribute directly to the magneto-resistance change when the magnetization free layer 24 is reversed, and performs the function of an underlayer relative to the active portion. It should be noted that almost all the magnetoresistive film has a crystal structure having face-centered cubic (111) orientation. If a layer of a body-centered cubic crystal structure is included in the magnetoresistive film, crystallinity of the entire magnetoresistive film is deteriorated. Therefore, it is desirable to restrain the portion of the body-centered cubic structure as much as possible. In sample A, the magnetization pinned layer 21 as the underlayer is formed of $(Fe_{0.5}Co_{0.5})_{99}Cu_1$, which has the body-centered cubic crystal structure, with the result that the crystallinity of the magnetoresistive film is poor. On the other hand, it is considered reasonable to understand that, since a $Ni_{80}Fe_{20}$ layer, which has the face-centered cubic structure, is substituted for the magnetization pinned layer 21 in sample B, the film quality was improved and the value of normalized $A\Delta R$ was increased in sample B.

In samples C and D, attentions were paid to the coercive force of the magnetization free layer so as to change the materials of the magnetization free layer for comparison. The magnetization free layer is required to have a low coercive force Hc in order to increase the sensitivity to the signal magnetic field generated from the magnetic recording medium. It is known to the art that a $CO_{90}Fe_{10}$ layer having a face-centered cubic structure has a low coercive force, and that a $Co_{50}Fe_{50}$ layer having a body-centered cubic structure has a high coercive force. As a matter of fact, sample C using the $Co_{50}Fe_{50}$ alloy for the magnetization free layer was found to have a high coercive force Hc of 16 Oe. Such being the situation, the $Co_{90}Fe_{10}$ alloy was used for the magnetization free layer in sample D while accepting the demerit that the magnetoresistance change would be decreased, with the result that the coercive force Hc was lowered to 7 Oe.

Thirteenth Embodiment

Figure 13:
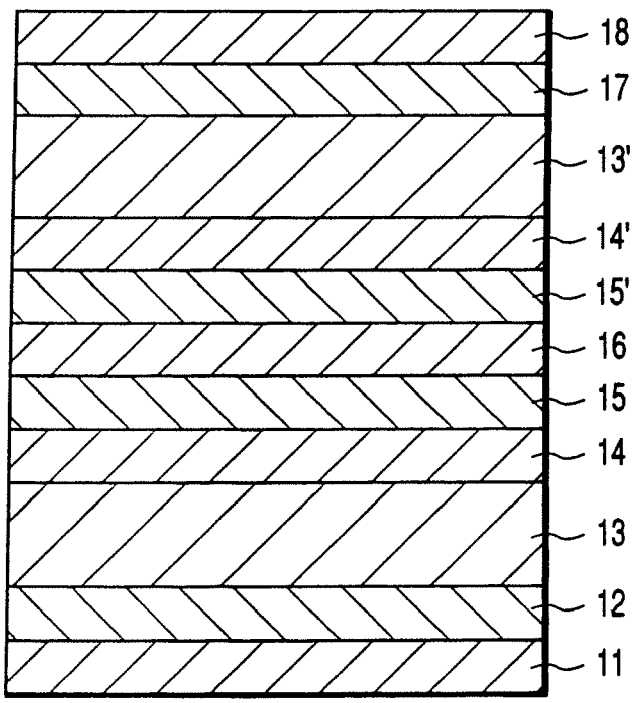
FIG. 13 is a cross sectional view showing the configuration of a current perpendicular to plane type magnetoresistive device according to the thirteenth embodiment of the present invention.

FIG. 13 shows the configuration of a magnetoresistive device of a dual structure. The magnetoresistive device shown in FIG. 13 comprises the lower electrode 11, the underlayer 12, the antiferromagnetic layer 13, the magnetization pinned layer 14, the nonmagnetic intermediate layer 15, the magnetization free layer 16, the second nonmagnetic intermediate layer 15', the second magnetization pinned layer 14', the second antiferromagnetic layer 13', the protective layer 17, and the upper layer 18.

Prepared for comparison were a typical magnetoresistive device as shown in FIG. 1 and a magnetoresistive device of a dual structure as shown in FIG. 13, as follows:

Typical structure: lower electrode/5 nm-Ta/5 nm-NiFeCr/15 nm-PtMn/7 nm-$Co_{100-x}Fe_x$/7 nm-Cu/7 nm-$Co_{100-x}Fe_x$/10 nm-Ta/upper electrode.

Dual structure: lower electrode/5 nm-Ta/5 nm-NiFeCr/15 nm-PtMn/7 nm-$Co_{100-x}Fe_x$/7 nm-Cu/7 nm-$Co_{100-x}Fe_x$/7 mn-Cu/7 nm-$Co_{100-x}Fe_x$/15 nm-PtMn/10 nm-Ta/upper electrode.

The effect of increasing the magnetoresistance change was produced by adjusting appropriately the compositions and the crystal structures of each of the magnetization pinned layer and the magnetization free layer even in the magnetoresistive device of the particular dual structure. Also, the magnetoresistive device of the dual structure exhibited magneto-resistance change about 3 times as high as that produced by the typical magnetoresistive device.

Fourteenth Embodiment

FIG. 14 shows the configuration of a magneto-resistive device in which each of the magnetization pinned layer and the magnetization free layer was formed of a laminate structure comprising a ferromagnetic layer and a nonmagnetic layer (insert layer). Specifically, the magnetoresistive device shown in FIG. 14 comprises the lower electrode 11, the underlayer 12, the antiferromagnetic layer 13, the magnetization pinned layer 14 formed of a laminate structure including the ferromagnetic layers 31 and the nonmagnetic layers 32, the nonmagnetic intermediate layer 15, the magnetization free layer formed of a laminate structure including the ferromagnetic layers 31 and the nonmagnetic layers 32, the protective layer 17, and the upper electrode 18. In each of the magnetization pinned layer and the magnetization free layer included in the magnetoresistive device shown in FIG. 14, the ferromagnetic layers 31 are ferromagnetically coupled with each other with the nonmagnetic layer 32 interposed therebetween.

To be more specific, manufactured was a magnetoresistive device having a laminate structure of: lower electrode/5 nm-Ta/5 nm-NiFeCr/15 nm-PtMn/[1 nm-$Co_{50}Fe_{50}$/t nm-Cu]×7/7 nm-Cu/[1 nm-$Co_{50}Fe_{50}$/t nm-Cu]×7/10 nm-Ta/upper electrode.

It should be noted that the expression "[1 nm-$Co_{50}Fe_{50}$/t nm-Cu]×7" given above represents "1 nm-$Co_{50}Fe_{50}$/t nm-Cu/1 nm-$Co_{50}Fe_{50}$/t nm-Cu/1 nm-$Co_{50}Fe_{50}$/t nm-Cu/1 nm-$Co_{50}Fe_{50}$/t nm-Cu/1 nm-$Co_{50}Fe_{50}$/t nm-Cu/1 nm-$Co_{50}Fe_{50}$.sup.1".

Figure 19:
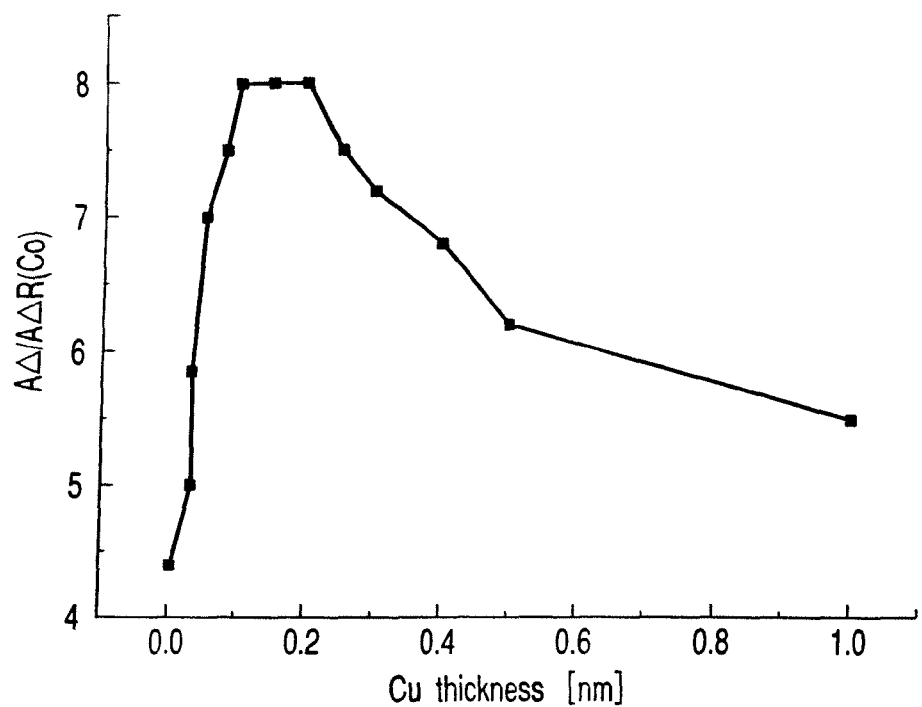
FIG. 19 is a graph showing a relationship between magnetoresistance change and thickness of the Cu film in a current perpendicular to plane type magneto-resistive device according to one embodiment of the present invention in which a laminate structure of a $Co_{50}Fe_{50}$ layer and a Cu layer is employed for forming each of the magnetization pinned layer and the magnetization free layer.

FIG. 19 is a graph showing a relationship between thickness of the Cu layer and output. As apparent from the graph of FIG. 19, a large effect is produced where the thickness of the Cu layer falls within a range of between 0.03 nm and 1 nm.

According to the result of analysis by EXAFS, it has been found that, where the thickness of the Cu layer falls within the range noted above, the Cu layer is greatly affected by the surrounding $Co_{50}Fe_{50}$ layers so as to assume the body-centered cubic structure, not the face-centered cubic structure. The magneto-resistive device under the particular state permits achieving the higher magnetoresistance change $A\Delta R$ than that in the case of the uniform Cu addition as in the fifth embodiment. It is considered reasonable to understand that the periodic change in the Cu concentration affects the band structure of the $Co_{50}Fe_{50}$ alloy itself so as to increase the difference in conduction between the majority spin and the minority spin. Incidentally, in the analysis by n-EDX, the composition appeared to be uniform because of accuracy of the measurement.

Also, the device in which the thickness of the Cu layer was set at 1 nm exhibited the magnetoresistance change about 1.4 to 3 times as large as that exhibited by the magnetoresistive device constructed as shown in FIG. 1, i.e., the laminate structure of lower electrode/5 nm-Ta/5 nm-NiFeCr/15 nm-PtMn/7 nm-$Co_{50}Fe_{50}$/7 mn-Cu/7 mn-$Co_{50}Fe_{50}$/10 nm-Ta/upper electrode.

The alloy producing the effect described above is not limited to the $Co_{50}Fe_{50}$ alloy, and the similar effect was recognized in any of the Co—Fe binary alloy, the Ni—Fe binary alloy, the Ni—Co binary alloy, and the Fe—Co—Ni ternary alloy.

The effect of increasing the magnetoresistance change $A\Delta R$ was also recognized in the case of using a nonmagnetic layer formed of Cr, V, Ta, Nb, Sc, Ti, Zn, Ga, Ge, Zr, Hf, Y, Tc, Re, Rh, Ir, Pd, Pt, Ag, Au, B, Al, In, C, Si, Sn, Ca, Sr, or Ba.

For example, manufactured were (i) a sample in which 7 nm-$Ni_{66}Fe_{18}Co_{16}$ is used for the magnetization pinned layer and magnetization free layer and (ii) a sample in which [1 nm-$Ni_{66}Fe_{18}Co_{16}$/0.2 nm-Zr]×7 is used for the magnetization pinned layer and magnetization free layer.

More specifically, the film configuration of the former sample was as follows: lower electrode/5 nm-Ta/5 nm-NiFeCr/15 mn-PtMn/7 nm-$Ni_{66}Fe_{18}Co_{16}$/7 nm-Cu/7 nm-$Ni_{66}Fe_{18}Co_{16}$/10 nm-Ta/upper electrode.

The film configuration of the latter sample was as follows: lower electrode/5 nm-Ta/5 nm-NiFeCr/15 nm-PtMn/7 nm-[1 nm-$Ni_{66}Fe_{18}Co_{16}$/0.2 mn-Zr]×7/7 nm-Cu/7 nm-[1 nm-$Ni_{66}Fe_{18}Co_{16}$/0.2 nm-Zr]×7/10 mn-Ta/upper electrode.

The magnetoresistance change was found to be about 3.5 times for the former sample, and about 6 times for the latter sample, as compared with that of the magnetoresistive device including a free layer and a pinned layer each formed of a pure Co.

Further, the values of magnetoresistance change were compared with respect to samples different in the number of alternate lamination in the magnetization pinned layer and the magnetization free layer.

The film configuration of the manufactured samples was as follows: lower electrode/5 nm-Ta/5 nm-NiFeCr/15 nm-PtMn/[t nm-$Fe_{50}Co_{50}$/0.1 mn-Cu]×n/7 nm-Cu/[t nm-$Fe_{50}Co_{50}$/0.1 mn-Cu]×n/10 nm-Ta/upper electrode, where the value of (t×n) was fixed to 7 nm, while n was set to 3, 5, 7 or 10.

Figure 22:
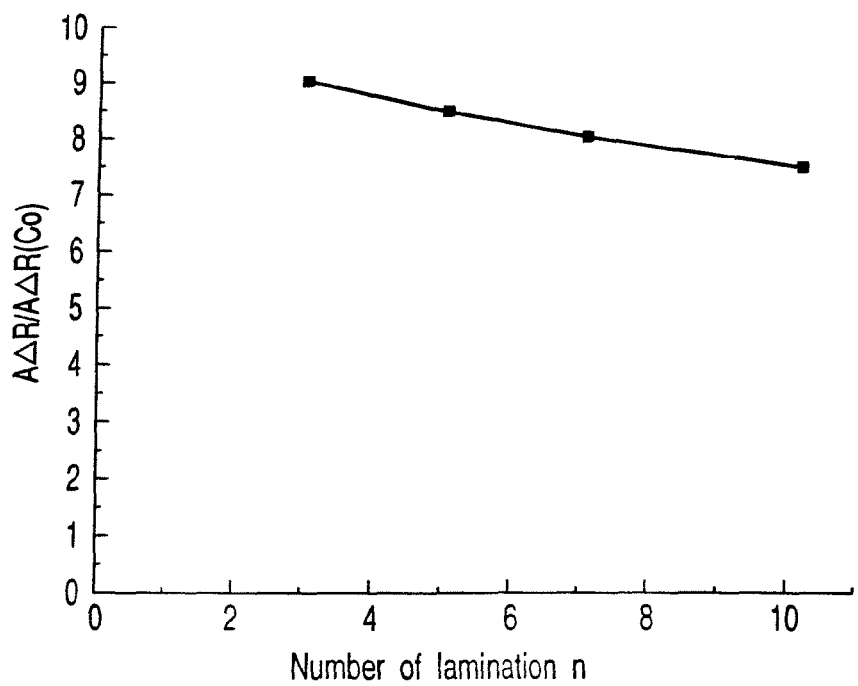
FIG. 22 is a graph showing a relationship between magnetoresistance change and number of lamination of a ferromagnetic layer and a nonmagnetic layer forming the pinned layer and the free layer in the current perpendicular to plane type magnetoresistive device according to the fourteenth embodiment of the present invention.

FIG. 22 shows a relationship between the magnetoresistance change and the number of alternate lamination. It was found that the magnetoresistance change increased as the number of lamination decreased. Incidentally, the tendency as described above was confirmed for another device having the pinned layer and the free layer formed of a laminate of a binary or ternary alloy containing elements selected from Fe, Co and Ni and an insert layer, not limited to the case where $Fe_{50}Co_{50}$ was used for the ferromagnetic material. The similar effect to that described above was also confirmed in respect to the insert layer formed of Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr or Ba, not limited to the case where Cu was used for the insert layer.

Further, manufactured were devices having the film configuration as follows:

(i) lower electrode/5 nm-Ta/5 nm-NiFeCr/15 nm-PtMn/[1 nm-$Ni_{80}Fe_{20}$/0.1 nm-M]×7/7 nm-Cu/[1 nm-$Ni_{80}Fe_{20}$/0.1 nm-M]×7/10 nm-Ta/an upper electrode, and (ii) lower electrode/5 nm-Ta/5 nm-NiFeCr/15 nm-PtMn/[1 nm-$Ni_{66}Fe_{16}Co_{18}$/0.1 nm-M]×7/7 nm-Cu/[1 nm-$Ni_{66}Fe_{16}Co_{18}$/0.1 nm-M]×7/10 nm-Ta/upper electrode.

It should be noted that the expression "[1 nm-$Ni_{80}Fe_{20}$/0.1 nm-M]×7" given above represents "1 nm-$Ni_{80}Fe_{20}$/0.1 nm-M/1 nm-$Ni_{80}Fe_2$/0.1 nm-M/1 nm-$Ni_{80}Fe_{20}$/0.1 nm-M/1 nm-$Ni_{80}Fe_{20}$/0.1 nm-M/1 nm-$Ni_{80}Fe_{20}$/0.1 nm-M/1 nm-$Ni_{80}Fe_{20}$".

The normalized resistance change in the devices having the above film configuration (i) found to be 2.5 times for the device having no insert layer, 3.2 times for a Zn insert layer, 3 times for a Ti insert layer, 3.2 times for a Mn insert layer, 4.2 times for a Cu insert layer, 4.5 times for a Hf insert layer, 4.5 times for a Ga insert layer, 3.2 times for a Ge insert layer, and 4.2 times for a Zr insert layer.

The normalized resistance change in the devices having the above film configuration (ii) found to be 3.5 times for the device having no insert layer, 4.1 times for a Zn insert layer, 4.2 times for a Ti insert layer, 4.2 times for a Mn insert layer, 4.2 times for a Cu insert layer, 5 times for a Hf insert layer, 5 times for a Ga insert layer, 4 times for a Ge insert layer, and 5 times for a Zr insert layer.

The above effects were obtained where the thickness of the insert layer was within a range of between 0.03 nm and 1 nm.

The similar effect to that described above was also confirmed in respect to the insert layer formed of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr or Ba, and having a thickness ranging from 0.03 nm to 1 nm.

Fifteenth Embodiment

FIG. 15 shows the configuration of another magnetoresistive device. The magnetoresistive device shown in FIG. 15 comprises the lower electrode 11, the underlayer 12, the antiferromagnetic layer 13, the magnetization pinned layer 14 formed of the laminate structure of the first ferromagnetic layer 33 and the second ferromagnetic layer 34, the nonmagnetic intermediate layer 15, the magnetization free layer 16 formed of the laminate structure of the first ferromagnetic layer 33 and the second ferromagnetic layer 34, the protective layer 17, and the upper electrode 18.

The effect of increasing the magnetoresistance change was produced by adjusting appropriately the composition and the crystal structure of the ferromagnetic layers forming each of the magnetization pinned layer and the magnetization free layer.

Sixteenth Embodiment

It is not absolutely necessary for the magnetization free layer and the magnetization pinned layer to be the same in composition. For comparison, prepared were magnetoresistive devices in which the compositions of the magnetization free layer and the magnetization pinned layer were changed, together with the typical magnetoresistive device constructed as shown in FIG. 1, as follows:

(A) Typical Element: lower electrode/5 nm-Ta/5 nm-NiFeCr/15 nm-PtMn/7 nm-$Co_{100-x}Fe_x$/7 nm-Cu/7 nm-$Co_{100-x}Fe_x$/10 nm-Ta/upper electrode.

(B) Change in Magnetization Pinned layer alone: lower electrode/5 nm-Ta/5 nm-NiFeCr/15 nm-PtMn/7 nm-$Fe_{50}Co_{50}$/7 nm-Cu/7 nm-$Co_{100-x}Fe_x$/10 nm-Ta layer/upper electrode.

(C) Change in Both Magnetization Free Layer and Magnetization Pinned layer: lower electrode/5 nm-Ta/5 nm-NiFeCr/15 nm-PtMn/7 nm-$Fe_{50}Co_{50}$/7 nm-Cu layer/7 nm-$Fe_{50}Co_{50}$/10 nm-Ta/upper electrode.

The magnetoresistance change for the device (B) was found to be 1.8 times as large as that for the device (A), and the magnetoresistance change for the device (C) was found to be 2.2 times as large as that for the device (A). The device (B), which is certainly inferior to the device (C) in the magnetoresistance change, permits improving soft magnetic characteristics so as to suppress Barkhausen noise of the magnetic head and, thus, is practically valuable. Such being the situation, it is effective to optimize individually the film configuration of each of the magnetization pinned layer and the magnetization free layer.

Further, manufactured were devices having the film configuration as follows: a lower electrode/5 nm-Ta/5 nm-NiFeCr/5 nm-PtMn/a pinned layer/7 nm-Cu/a free layer/10 nm-Ta/an upper electrode. In these devices, the structure of each of the pinned layer and the free layer were varied as follows:

(D) pinned layer: (1 nm-$Fe_{50}Co_{50}$/0.1 nm-Cu)×7 free layer: (1 nm-$Fe_{50}Co_{50}$/0.1 nm-Cu)×7

(E) pinned layer: (1 nm-$Fe_{50}Co_{50}$/0.1 nm-Cu)×7, free layer: (1 nm-$Ni_{66}Fe_{16}Co_{18}$/0.1 nm-Zr)×7

(F) pinned layer: (1 nm-$Fe_{50}Co_{50}$/0.1 nm-Cu)×7, and free layer: 1 nm-$Co_{90}Fe_{10}$/(1 nm-$Ni_{66}Fe_{16}Co_{18}$/0.1 nm-Zr)×6

(G) pinned layer: (1 nm-$Fe_{50}Co_{50}$/0.1 nm-Cu)×7, free layer: (1 nm-$Ni_{80}Fe_{20}$/0.1 nm-Zr)×7

(H) pinned layer: (1 nm-$Fe_{50}Co_{50}$/0.1 nm-Cu)×7, free layer: 1 nm-$Co_{90}Fe_{10}$/(1 nm-$Ni_{80}Fe_{20}$/0.1 nm-Zr)×6

(I) pinned layer: (1 nm-$Fe_{33}Co_{33}Ni_{34}$/0.1 nm-Cu)×7, free layer: (1 nm-$Fe_{33}Co_{33}Ni_{34}$/0.1 nm-Cu)×7

(J) pinned layer: (1 nm-$Fe_{33}Co_{33}Ni_{34}$/0.1 nm-Cu)×7, free layer: (1 nm-$Ni_{66}Fe_{16}Co_{18}$/0.1 nm-Zr)×7

(K) pinned layer: (1 nm-$Fe_{33}Co_{33}Ni_{34}$/0.1 nm-Cu)×7, free layer: 1 nm-$Co_{90}Fe_{10}$/(1 nm-$Ni_{66}Fe_{16}Co_{18}$/0.1 nm-Zr)×6

(L) pinned layer: (1 nm-$Fe_{33}Co_{33}Ni_{34}$/0.1 nm-Cu)×7, free layer: (1 nm-$Ni_{80}Fe_{20}$/0.1 nm-Zr)×7

(M) pinned layer: (1 nm-$Fe_{33}Co_{33}Ni_{34}$/0.1 nm-Cu)×7, free layer: 1 nm-$Co_{90}Fe_{10}$/(1 nm-$Ni_{80}Fe_{20}$/0.1 nm-Zr)×6

The normalized resistance change found to be 8 times for (D), 6 times for (E), 7 times for (F), 7 times for (G), 7.6 times for (H), 6 times for (I), 5.5 times for (J), 5.8 times for (K), 5 times for (L) and 5.5 times for (M).

As can be seen from the above results, even if the pinned layer and the free layer are different in structure, employing the pinned layer and the free layer having a laminated structure can increase magnetoresistance change. In the above devices, the insert layer was made of Cu or Zr having a thickness of 0.1 nm. However, similar effect to that described above was also obtained where the insert layer is made of an element selected from the group consisting of Cr, Nb, Ta, V, Sc, Ti, Mn, Zn, Ga, Ge, Zr, Hf, Y, Tc, Re, Ru, Rh, Ir, Pd, Pt, Cu, Ag, Au, B, Al, In, C, Si, Sn, Ca, Sr, Ba, O, N and F. The above effect was obtained when the thickness of the insert layer was ranging from 0.03 nm to 1 nm, preferably 0.5 nm or less. Also, the above effect was obtained when the thickness of each of the pinned layer and the free layer was varied from 0.5 nm to 3.5 nm.

Still further, manufactured were devices having the film configuration as follows: a lower electrode/5 nm-Ta/5 nm-NiFeCr/15 nm-PtMn/a pinned layer/7 nm-Cu/a free layer/10 nm-Ta/an upper electrode. In these devices, the composition of each of the pinned layer and the free layer was varied as follows:

(N) pinned layer: 7 nm-$(Fe_{50}Co_{50})_{98}Cu_2$, free layer: 7 nm-$(Fe_{50}Co_{50})_{98}Cu_2$ (O) pinned layer: 7 nm-$(Fe_{50}Co_{50})_{98}Cu_2$, free layer: 7 nm-$(Ni_{66}Fe_{16}Co_{18})_{97}Zr_3$ (P) pinned layer: 7 nm-$(Fe_{50}Co_{50})_{98}Cu_2$, free layer: 1 nm-$Co_{90}Fe_{10}$/6 nm-$(Ni_{66}Fe_{16}Co_{18})_{97}Z$-$R_3$ (Q) pinned layer: 7 nm-$(Fe_{50}Co_{50})_{98}Cu_2$, free layer: (1 nm-$Ni_{80}Fe_{20}$/0.1 nm-Cu)×7

(R) pinned layer: 7 nm-$(Fe_{50}Co_{50})_{98}Cu_2$, a free layer: 1 nm-$Co_{90}Fe_{10}$/(1 nm-$Ni_{80}Fe_{20}$/0.1 nm-Cu)×6

(S) pinned layer: 7 nm-$(Fe_{33}Co_{33}Ni_{34})_{97}Cu_3$, free layer: 7 nm-$(Fe_{33}Co_{33}Ni_{34})_{97}Cu_3$ (T) pinned layer: 7 nm-$(Fe_{33}Co_{33}Ni_{34})_{97}Cu_3$, free layer: 7 nm-$(Ni_{66}Fe_{16}Co_{18})_{97}Zr_3$ (U) pinned layer: 7 nm-$(Fe_{33}Co_{33}Ni_{34})_{97}Cu_3$, free layer: 1 nm-$Co_{90}Fe_{10}$/6 nm-$(Ni_{66}Fe_{16}Co_{18})_{97}Zr_3$ (V) pinned layer: 7 nm-$(Fe_{33}Co_{33}Ni_{34})_{97}Cu_3$, free layer: 7 nm-$(Ni_{80}Fe_{20})_{97}Zr_3$ (W) pinned layer: 7 nm-$(Fe_{33}Co_{33}Ni_{34})_{97}Cu_3$, free layer: 1 nm-$Co_{90}Fe_{10}$/6 nm-$(Ni_{80}Fe_{20})_{97}Zr_3$ The normalized resistance change found to be 7 times for (N), 6 times for (O), 6.5 times for (P), 5.5 times for (Q), 6.3 times for (R), 6.5 times for (S), 5.8 times for (T), 6 times for (U), 5 times for (V) and 5.5 times for (W).

As can be seen from the above results, even if the pinned layer and the free layer are different in structure, employing the pinned layer and the free layer having an appropriate composition can increase magnetoresistance change. In the above devices, the additive element was Cu or Zr. However, similar effect to that described above was also obtained where the additive element was selected from the group consisting of Cr, Nb, Ta, V, Sc, Ti, Mn, Zn, Ga, Ge, Zr, Hf, Y, Tc, Re, Ru, Rh, Ir, Pd, Pt, Cu, Ag, Au, B, Al, In, C, Si, Sn, Ca, Sr, Ba, O, N and F. These additive elements were effective within a range of between 0.1 atomic % and 30 atomic %, preferably not larger than 10 atomic %.

A magnetic head assembly having the magnetic head of the present invention mounted thereon and a magnetic disk apparatus having the above-noted magnetic head assembly mounted thereon will now be described with reference to FIGS. 16A and 16B.

Figure 16A:
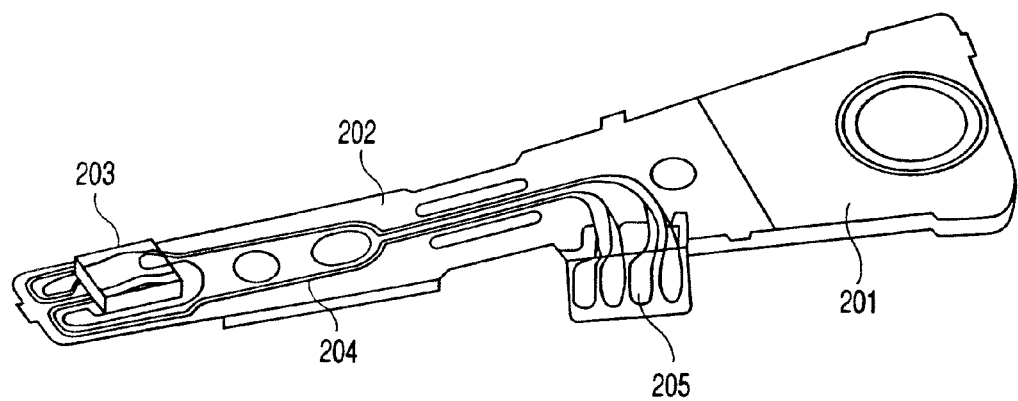
FIG. 16A is a perspective view showing a magnetic head assembly according to one embodiment of the present invention.

FIG. 16A is a perspective view showing the magnetic head assembly having a CPP-MR head mounted thereon. As shown in the drawing, an actuator arm 201 is provided with a hole for fixation to the stationary shaft within the magnetic disk apparatus and includes a bobbin portion for holding a driving coil (not shown). A suspension 202 is fixed to one end of the actuator arm 201. A head slider 203 having a CPP-MR head mounted thereon is mounted to the tip of the suspension 202. Also, a lead wire 204 for writing and reading signals is arranged on the suspension 202. The lead wire 204 is connected at one end to each electrode of the CPP-MR head incorporated in the head slider 203 and is connected at the other end to electrodes pad 205.

Figure 16B:
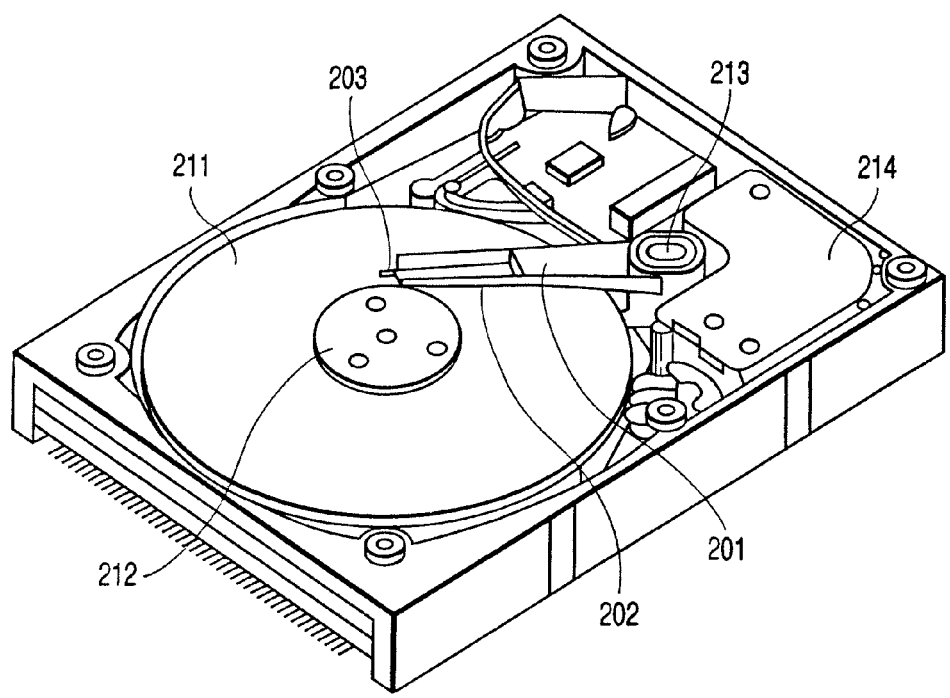
FIG. 16B is a perspective view showing the internal structure of the magnetic disk apparatus according to one embodiment of the present invention.

FIG. 16B is a perspective view showing the internal structure of the magnetic disk apparatus having the magnetic head assembly, which is shown in FIG. 16A, mounted thereon. A magnetic disk 211 is mounted to a spindle 212 and is rotated by a motor (not shown) that is rotated in response to the control signal generated from the driving apparatus control section (not shown). The actuator arm 201 is fixed to a stationary shaft 213 so as to support the suspension 202 and the head slider 203 at the tip of the suspension 202. If the magnetic disk 211 is rotated, the air-bearing surface of the head slider 203 is held floating by a predetermined height from the surface of the magnetic disk 211 so as to carry out recording-reproducing of information. A voice coil motor 214, which is a type of a linear motor, is mounted to the proximal end of the actuator arm 201. The voice coil motor 214 comprises a driving coil (not shown) wound about the bobbin portion of the actuator arm 201, and a magnetic circuit consisting of a permanent magnet and a counter yoke arranged to face each other with the driving coil interposed therebetween. The actuator arm 201 is supported by ball bearings (not shown) arranged in upper and lower portions of the stationary shaft 213 so as to be rotated by the voice coil motor 214.

The magnetoresistive device of the present invention can also be applied to a magnetic random access memory (MRAM).

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin-valve type giant magnetoresistance effect device, comprising:

a magnetization pinned layer, magnetization direction of which is substantially pinned to one direction;

a magnetization free layer, magnetization direction of which is changed in accordance with an external magnetic field;

a conductive nonmagnetic intermediate layer formed between the magnetization pinned layer and the magnetization free layer; and electrodes allowing a sense current to flow in a direction substantially perpendicular to a plane of a stack including the magnetization pinned layer, the nonmagnetic intermediate layer and the magnetization free layer, wherein the magnetization pinned layer and the magnetization free layer have a laminate structure comprising alternately laminated layers of:

(i) magnetic layers each substantially formed of an alloy represented by general formula (22-b) given below:

$$Fe_cCo_dNi_e \qquad (22\text{-}b)$$

where $20 \leq c \leq 60$ at %, $20 \leq d \leq 60$ at %, $20 \leq e \leq 33$ at %, and $c+d+e=100$; and (ii) non-magnetic layers each interposed between the magnetic layers, and each formed of at least one element selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F, and having a thickness t within a range of $0.3 \text{ nm} \leq t \leq 1.0 \text{ nm}$, and wherein the laminate structure comprises [magnetic layer/non-magnetic layer] x n, where n is an integer from 2 to 10.

2. The device according to claim 1, wherein (I) the alloy represented by the general formula (22-b) is selected from the group consisting of $Fe_{33}Co_{34}Ni_{33}$, $Fe_{60}Co_{20}Ni_{20}$ and $Fe_{20}Co_{60}Ni_{20}$, and (ii) the non-magnetic layer is formed of Cu.

* * * * *